United States Patent
Chen

(10) Patent No.: US 11,640,913 B2
(45) Date of Patent: May 2, 2023

(54) PHOTOELECTRIC DEVICE

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 204 days.

(21) Appl. No.: 17/117,352

(22) Filed: Dec. 10, 2020

(65) Prior Publication Data

US 2021/0202281 A1 Jul. 1, 2021

(30) Foreign Application Priority Data

Dec. 31, 2019 (TW) .................... 108148589

(51) Int. Cl.
*H01L 21/67* (2006.01)

(52) U.S. Cl.
CPC .. *H01L 21/67132* (2013.01); *H01L 21/67144* (2013.01); *H01L 2221/68322* (2013.01); *H01L 2221/68354* (2013.01)

(58) Field of Classification Search
CPC ......... H01L 21/67132; H01L 21/67144; H01L 2221/68322; H01L 2221/68354; H01L 33/62; H01L 25/0753; H01L 33/48; H01L 2933/0033; H01L 2933/0066
USPC ........................................ 438/597
See application file for complete search history.

(56) References Cited

U.S. PATENT DOCUMENTS

| 9,865,832 B2* | 1/2018 | Bibi ............. H01L 27/3244 |
| 11,037,980 B2* | 6/2021 | Iguchi ............. G09G 3/32 |
| 2019/0189477 A1 | 6/2019 | Chen |

FOREIGN PATENT DOCUMENTS

TW         201929249 A      7/2019

* cited by examiner

*Primary Examiner* — Vu A Vu
(74) *Attorney, Agent, or Firm* — Muncy, Geissler, Olds & Lowe, P.C.

(57) ABSTRACT

A photoelectric device includes a target substrate, a circuit pattern layer disposed on the target substrate, a plurality of micro photoelectric elements electrically connected to the circuit pattern layer, and a supplemental repair element electrically connected to the circuit pattern layer. The target substrate is configured with a plurality of connection positions and a repair position disposed with an offset with relative to a corresponding one of the connection positions. The offset is greater than or equal to zero. The micro photoelectric elements are individually disposed on at least a part of the connection positions of the target substrate. The supplemental repair element has an electrode disposed on the repair position of the target substrate, and the electrode is connected to the circuit pattern layer. On the target substrate, the supplemental repair element is arbitrary with respect to the micro photoelectric elements.

10 Claims, 21 Drawing Sheets

PHOTOELECTRIC DEVICE

CROSS REFERENCE TO RELATED APPLICATIONS

This Non-provisional application claims priority under 35 U.S.C. § 119(a) on Patent Application No(s). 108148589 filed in Taiwan, Republic of China on Dec. 31, 2019, the entire contents of which are hereby incorporated by reference.

BACKGROUND

Technology Field

This disclosure relates to a photoelectric device and, in particular, to a photoelectric device containing micro photoelectric elements and a repair method thereof.

Description of Related Art

To manufacture the conventional light-emitting diodes (LED), which have the side lengths greater than 150 μm, many processes including epitaxy, photolithography, metal plating, etching, and fully cutting are performed to obtain LED dies. Afterwards, the electrode of the LED die is electrically connected to the circuit substrate by wire bonding or eutectic bonding. The conventional LED can be screened by different sorting modes according to characteristics such as wavelength, light intensity, lighting angle, or working voltage before or after packaging. Regarding the micro light-emitting diodes (μLED), due to the dimension of the μLED is very small (e.g. only 25 μm or less), the conventional LED sorting device is not suitable for screening the μLEDs. Therefore, many solutions, such as applying to the circuit substrate without sorting step, or utilizing a new electricity detection mode, are introduced.

Anyway, the μLED aims to achieve good working status effectively and efficiently after being mounted on the circuit board. Even if the μLEDs have sorted before being mounted on the circuit board, there are still chances that defective μLEDs (hereinafter referred to as defective products) exist, or poor electrical connections after the mounting step happen as well. In practice, a large amount of μLEDs are mounted on the circuit board, the pitches and dimensions of the μLEDs are very tinny, and the heights of the μLEDs are often uneven due to the reasons of manufacturing process or raw material deviations. With considering the above issues, it is difficult to repair the aforementioned defects without damaging the circuit structure on the board or other good μLEDs (hereinafter referred to as good products) surrounding the defective products.

SUMMARY

This disclosure is to provide a photoelectric device and a repair method thereof, which can be widely applied to repair the photoelectric device mainly composed of micro photoelectric elements.

A photoelectric device comprises a target substrate, a circuit pattern layer, a plurality of micro photoelectric elements, and a supplemental repair element. The target substrate is configured with a plurality of connection positions and a repair position disposed with an offset with relative to a corresponding one of the connection positions. The offset is greater than or equal to zero. The circuit pattern layer is disposed on the target substrate. The micro photoelectric elements are disposed on the target substrate and electrically connected to the circuit pattern layer. The micro photoelectric elements are individually disposed on at least a part of the connection positions of the target substrate, respectively. The supplemental repair element is disposed on the repair position of the target substrate. The supplemental repair element has an electrode electrically connected to the circuit pattern layer. On the target substrate, the supplemental repair element is arbitrary with respect to the micro photoelectric elements.

In some embodiments, the electrode of the supplemental repair element is connected to the circuit pattern layer by laser welding.

In some embodiments, the junction portion of the circuit pattern layer and the supplemental repair element is defined with a reflectivity less than 20%.

In some embodiments, the offset is equal to zero, and the supplemental repair element is disposed at one of the connection positions.

In some embodiments, one of the micro photoelectric elements is removed and replaced by the supplemental repair element.

In some embodiments, the supplemental repair element and the micro photoelectric elements together form a matrix array.

In some embodiments, a circuit connection between the circuit pattern layer and one of the micro photoelectric elements is replaced by a circuit connection between the circuit pattern layer and the supplemental repair element.

In some embodiments, the micro photoelectric elements are arranged as a matrix array, and the supplemental repair element is disposed aside one of the micro photoelectric elements.

In some embodiments, the photoelectric device further comprises a cutting line, and the cutting line interrupts the circuit connection between the circuit pattern layer and the corresponding micro photoelectric element.

In some embodiments, each of the supplemental repair element and the micro photoelectric elements is a flip-chip micro light-emitting diode.

In some embodiments, the target substrate comprises a plurality of connection position groups, which are composed of the connection positions, and the repair position is disposed adjacent to the corresponding connection position group and disposed with an offset with relative to the corresponding connection position. The micro photoelectric elements are divided into a plurality of micro photoelectric element groups, which are disposed corresponding to the connection position groups, respectively. The supplemental repair element is disposed on the repair portion disposed adjacent to one of the micro photoelectric element groups. Each of the supplemental repair element and the micro photoelectric elements of the corresponding micro photoelectric element groups comprises two electrodes, and one electrode of the supplemental repair element is electrically connected to one of the electrodes of the micro photoelectric elements of the corresponding micro photoelectric element groups. The circuit connection between the electric pattern layer and the other electrode of the corresponding micro photoelectric element of the micro photoelectric element group is replaced by the circuit connection between the circuit pattern layer and the other electrode of the supplemental repair element.

In some embodiments, the photoelectric device further comprises a cutting line, and the cutting line interrupts the circuit connection between the circuit pattern layer and the other electrode of the corresponding micro photoelectric element of the micro photoelectric element group.

In some embodiments, the circuit pattern layer further comprises a repair line corresponding to the repair position, a plurality of circuit extension segments corresponding to the connection positions of the connection position groups, and a plurality of junction ports formed by the circuit extension segments and the repair line. One of the junction ports is electrically connected to the corresponding circuit extension segment and repair line, and the other junction ports are in non-connection.

In some embodiments, the circuit pattern layer further comprises a repair line corresponding to the repair position, a circuit extension segment corresponding to one of the connection positions of the connection position groups, and a junction port formed by the circuit extension segment and the repair line. The junction port is electrically connected to the repair line.

In some embodiments, one of the junction ports is laser welded to the corresponding circuit extension segment and the repair line.

In some embodiments, the junction port is electrically connected to the repair line by laser welding.

In some embodiments, the welded junction port is defined with a reflectivity less than 20%.

A repair method of a photoelectric device is used to transfer a supplemental repair element to a photoelectric device containing a plurality of micro photoelectric elements. The supplemental repair element comprises an electrode, and the photoelectric device comprises a target substrate, a circuit pattern layer disposed on the target substrate, and a plurality of micro photoelectric elements disposed on the circuit substrate and electrically connected to the circuit pattern layer. The repair method comprises the following steps of:

selecting one of the micro photoelectric elements, wherein the target substrate is defined with a plurality of connection positions and a repair position disposed with an offset with relative to a corresponding one of the connection positions, the offset is greater than or equal to zero, and the micro photoelectric elements are individually disposed on at least a part of the connection positions of the target substrate, respectively;

picking up the supplemental repair element and transferring it to the repair position of the target substrate by a transfer device;

keeping the micro photoelectric elements contacted by the transfer device and irradiating at the repair position, thereby welding the electrode of the supplemental repair element to electrically connect to the circuit pattern layer of the target substrate, wherein the supplemental repair element is arbitrary with respect to the micro photoelectric elements on the target substrate; and removing the transfer device.

In some embodiments, before or after the step of removing the transfer device, the repair method further comprises: removing the selected micro photoelectric element on the target substrate.

In some embodiments, before or after the step of irradiating at the repair position, the repair method further comprises: forming a cutting line at a position on the circuit pattern layer close to one of the connection positions for interrupting a circuit connection between the circuit pattern layer and one of the micro photoelectric elements corresponding to the connection position.

In some embodiments, the cutting line is formed by laser.

In some embodiments, after the step of irradiating at the repair position, the junction portion of the circuit pattern layer and the supplemental repair element is defined with a reflectivity less than 20%.

In some embodiments, in the step of transferring the supplemental repair element, the transfer device comprises a transfer substrate and a buffer material disposed on the transfer substrate, wherein the buffer material is defined with a pressing plane.

In some embodiments, the buffer material is defined with a thickness greater than or equal to 4 μm.

In some embodiments, the step of selecting one of the micro photoelectric elements further comprises: selecting a part of the micro photoelectric elements; and after the step of transferring the supplemental repair element, the repair method further comprises: transferring a plurality of supplemental repair elements corresponding to a part of the micro photoelectric elements by the transfer device.

In some embodiments, before or after the step of transferring the supplemental repair element, the circuit pattern layer further comprises a repair line corresponding to the repair position, a circuit extension segment corresponding to one of micro photoelectric elements, and a junction port in non-connection with the circuit extension segment and the repair line.

In some embodiments, before or after the irradiating at the repair position, the repair method further comprises: melting the junction port by laser for electrically connecting the circuit extension segment to the repair line.

In some embodiments, the melted junction port is defined with a reflectivity less than 20%.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

In the following, the term "photoelectric device" can be, for example but not limited to, a display panel, a multimedia board, a sensing device, a display device, a semiconductor device, or a lighting device, etc., and can be a monochrome or full color device. Wherein, the display device can be applied to, for example, a virtual reality (VR) head-mounted display, an augmented reality head-mounted display, or a head-up display (HUD). In the following, the term "micro" of the micro photoelectric elements generally refers to a micron-scale photoelectric element, including a semiconductor device such as, for example but not limited to, a light-emitting diode, a photodiode, an IC and a sensor, and a component comprising any of the aforementioned devices. In the following, the term "target substrate" refers to a non-native substrate for receiving the micro photoelectric elements. The material of the native substrate or non-native substrate includes, for example but not limited to, polymers, plastics, resins, polyimide, polyethylene naphthalate, polyethylene terephthalate, metal, foil, glass, quartz, glass fiber, flexible glass, semiconductor, sapphire, gallium arsenide, silicon carbide, metal-glass fiber composite board, metal-ceramic composite board, or the likes. In the following, the term "matrix array" means the arrangement of a row, a column, or a matrix with rows and columns, or to regularly arrange in a polygon or irregular shape according to requirements, and this disclosure is not limited. The photoelectric device and the repair method thereof according to the embodiments of the disclosure will be described below with reference to related drawings, wherein the same components will be described with the same reference numbers or symbols. The illustrations of all implementation aspects of the disclosure are merely illustrative, and do not represent the actual sizes, proportions or quantities. In addition, the orientations "up" and "down" in the content of the following embodiments are merely used to indicate relative positional relationships. Furthermore, forming an element "on", "above", "below" or "under" another element may include the case of directly contacting two elements, or the case of indirectly contacting two elements, which means an additional element is disposed between two elements and the two elements do not directly contact with each other.

First Embodiment

Figure 1A:
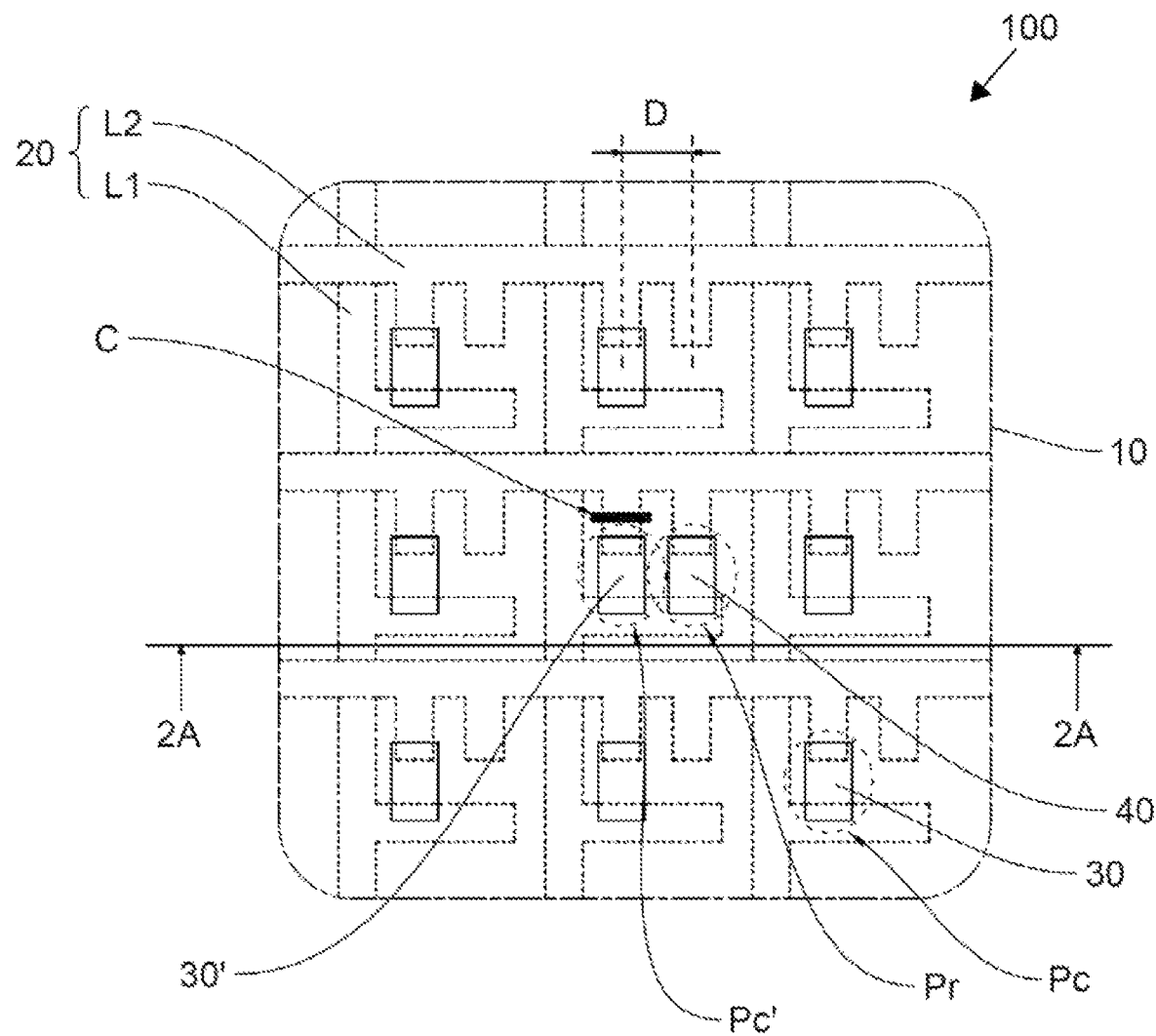
FIG. 1A is a schematic diagram showing a photoelectric device according to a first embodiment of this disclosure.
Figure 2A:
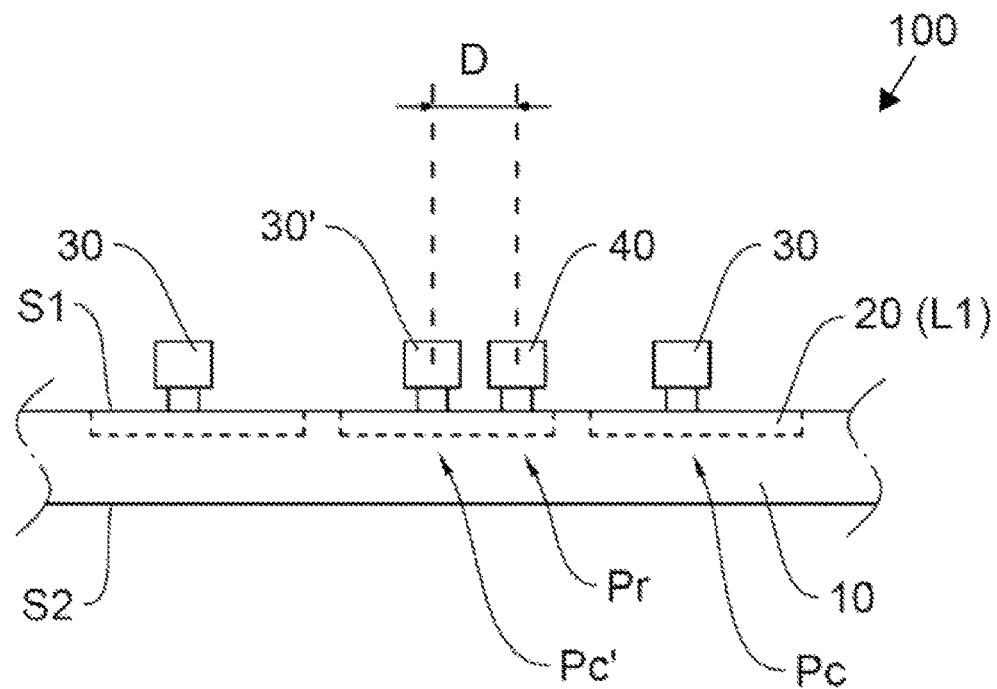
FIG. 2A is a side view of FIG. 1A.

FIGS. 1A and 2A are schematic diagrams showing a photoelectric device according to a first embodiment of this disclosure. Referring to FIGS. 1A and 2A, the photoelectric device 100 comprises a target substrate 10, a circuit pattern layer 20, a plurality of micro photoelectric elements, and a supplemental repair element 40. The target substrate 10 has two opposite surfaces S1 and S2. The target substrate is configured with a plurality of connection positions Pc and a repair position Pr, which is disposed with an offset D with relative to a corresponding connection position Pc of the connection positions Pc. In this disclosure, the offset D is greater than or equal to zero. In this embodiment, the offset D is, for example, greater than zero. The circuit pattern layer 20 may at least comprise a plurality of first circuit lines L1 and a plurality of second circuit lines L2 based on the circuit design of Active Matrix or Passive Matrix. The micro photoelectric elements are disposed on the surface S1 of the target substrate 10 and electrically connected to the circuit pattern layer 20. Each micro photoelectric element at least comprises two electrodes, which are electrically connected to the first circuit line L and the second circuit line L2, respectively. The micro photoelectric elements are disposed on at least a part of the connection positions Pc on the target substrate 10. In this embodiment, a defective micro photoelectric element 30' (i.e. defective product) is selected from the micro photoelectric elements. In this embodiment, one micro photoelectric element 30' is selected for an example, and the connection position corresponding to the defective micro photoelectric element 30' (herein referred to as defective connection position) is labeled by Pc'. The supplemental repair element 40 is a micro photoelectric element comprising at least one electrode. For easier understanding, the supplemental repair element 40 can be optionally a micro photoelectric element having the same characteristics as the micro photoelectric element 30'. The micro photoelectric elements (including the defective micro photoelectric element 30') and the supplemental repair element 40 can be, for example but not limited to, flip-chip µLEDs. The supplemental repair element 40 is disposed on the repair position Pr of the target substrate 10, and the electrode of the supplemental repair element 40 is electrically connected to the circuit pattern layer 20 by laser welding.

To be noted, the above-mentioned "defective product" refers to those that fail to achieve the predetermined function after screening with specific standards or conditions based on the characteristics such as wavelength, light intensity, lighting angle, or working voltage. For example, one of the micro photoelectric elements is classified as a defective product and labeled with the reference number of 30'. The "good product" is defined relative to the defective product. For example, the residual micro photoelectric devices 30 other than the micro photoelectric device 30' are defined as good products. In addition, the connection position Pc' represents a "defective connection position". For example, before the micro photoelectric elements 10 are mounted on the target substrate 10, some of the micro photoelectric elements (not shown) are determined as defective products due to the sorting step or any of other reasons, and then discarded. Therefore, the preset connection positions Pc on the target substrate 10 cannot be all filled by the micro photoelectric elements one by one, thereby leaving some connection positions Pc to be blank. Accordingly, in this embodiment, the micro photoelectric elements 30 are individually disposed on at least a part of the connection positions Pc of the target substrate 10, and the connection positions, which are not filled with any of the micro photoelectric elements 30 or 30', are also labeled as Pc'. After the micro photoelectric elements 30 are filled into all of the connection positions Pc one by one with or without performing the sorting step, if the micro photoelectric element 30', which is in malfunction or in bad connection, is detected, the connection position of this micro photoelectric element 30' will be labeled as Pc'.

To be noted, the preset multiple connection positions Pc are regularly arranged on the target substrate 10, and preferably arranged in array (Matrix). The micro photoelectric elements 30 and 30' are disposed on "at least a part" of the connection positions Pc can be realized as the micro photoelectric elements 30 and 30' are disposed on a part of the connection positions Pc, or the photoelectric elements 30 and 30' are disposed on the connection positions Pc excepting the part of connection positions (blank connection positions) corresponding to the defective micro photoelectric elements 30', which are removed due to the sorting step. In addition, the amount of the repair position Pr can be one, at least one, or more than one, and it is at least corresponding to the amount of the defective connection positions Pc'. The details thereof will be described hereinafter.

To be noted, on the target substrate 10, since the supplemental repair element 40 is selected based on the defective micro photoelectric element 30' or the required micro photoelectric element corresponding to the blank connection position Pc', the supplemental repair element 40 is arbitrary with respect to the micro photoelectric elements 30 and 30', which are arranged on the target substrate 10 regularly. This disclosure defines this situation as "the supplemental repair element is arbitrary with respect to the micro photoelectric elements". For the sake of easy understanding, the term "arbitrary" in this disclosure indicates irregular arrangement (e.g. not matrix array), occasionally occurred, or randomly distributed in objective respect, or recognition with a subjective intent, except following the existed regular arrangement (e.g. matrix array). In addition, the amount of the supplemental repair element(s) 40 is not limited to be one, or to equal to that of the repair position(s) Pr; no matter the amount of the supplemental repair element(s) 40 is one, at least one or more than one, the above explanation for the term that the supplemental repair element 40 is arbitrary with respect to the regularly arranged micro photoelectric elements 30 and 30' is all applicable.

For the sake of easy understanding, as shown in the drawings, the circuit pattern layer 20 of this embodiment comprises the interlaced first circuit lines L1 and second circuit lines L2, and at least one circuit extension segment (not labeled) extending from the corresponding one of the first circuit lines L1 and the second circuit lines L2. To be noted, the layout of the first circuit lines L1 and the second circuit lines L2 (or the extension segments thereof) is not limited to the interlaced arrangement of this embodiment. For example, the first circuit lines L1 and the second circuit lines L2 can be arranged in parallel, and they are alternately arranged. The connection positons Pc and Pc' of this embodiment are regularly arranged, and all of the micro photoelectric elements 30 corresponding to the connection positions Pc and Pc' are disposed individually corresponding to the first circuit lines L1 and the second circuit lines L2 (or the extension segments thereof). The above components can together form a matrix array. To be noted, this disclosure is not limited thereto. In addition, the design of the first circuit lines L1 and the second circuit lines L2 (or the extension segments thereof) on the circuit pattern layer 20 of this embodiment can be a single-layer structure or a multilayer structure. For example, regarding the single-layer structure, the cross region of the first circuit line L1 and the second circuit line L2 can be configured with, for example, an insulating layer for electrically isolating the first circuit line L1 and the second circuit line L2. Moreover, the single-layer or multilayer structure of the first circuit lines L1 and the second circuit lines L2 can be configured with conductive pads, which are disposed at the connection positions Pc and Pc' of the micro photoelectric elements 30 and 30' and/or the repair position Pr of the supplemental repair element 40. In this embodiment, the circuit pattern layer 20 has various kinds of designs, and the circuit designs thereof have huge variations due to the desired functions. Thus, the circuit pattern layer 20 disclosed and shown in this embodiment is only for an illustration and not to limit the scope of this disclosure.

To be noted, when the micro photoelectric element 30' is classified as a defective product, this embodiment can replace the micro photoelectric element 30' with a good product, i.e. the supplemental repair element 40. The supplemental repair element 40 can be disposed aside the micro photoelectric element 30' and then form a new circuit connection with the circuit pattern layer 20, which is configured to replace the circuit connection between the micro photoelectric element 30' and the circuit pattern layer 20. The method of using the new circuit connection to replace the old circuit connection can be achieved by the predesign of the circuit pattern layer 20. Optionally, in this embodiment, a cutting line C is formed across a part of the circuit pattern layer 20 close to the micro photoelectric element 30' (e.g. the extension segment of the second circuit line L2), thereby interrupting the circuit connection between the circuit pattern layer 20 and the micro photoelectric element 30'. Furthermore, there are still other solutions for interrupting the circuit connection between the circuit pattern layer 20 and the micro photoelectric element 30'. For example, a laser can be provided to form a cutting line across the micro photoelectric element 30' for damaging the structure or function of the micro photoelectric element 30', or a high-energy laser can be provided to the micro photoelectric element 30' for exploding or evaporating the micro photoelectric element 30'. Herein, the approach of providing a high-energy laser to explode or evaporate the micro photoelectric element 30' can be realized as one of the methods for removing the micro photoelectric element 30'. Moreover, the above-mentioned cutting line C can also be formed by plasma. In other words, the method for forming the cutting line C is not limited to the laser cutting.

In this embodiment, the micro photoelectric elements (including the defective micro photoelectric element 30') together form a matrix array, and the supplemental repair element 40 is disposed aside the micro photoelectric element 30' with an offset with relative to the micro photoelectric element 30'. The supplemental repair element 40 and the circuit pattern layer 20 form a circuit connection for replacing the circuit connection between the micro photoelectric element 30' and the circuit pattern layer 20. This method can be realized as a repair method for repairing the matrix array of the micro photoelectric elements, and the supplemental repair element 40 can be realized as a repair element excluded by the matrix array of the micro photoelectric elements. The new circuit connection is constructed by electrically connecting one electrode of the supplemental repair element 40 to the second circuit line L2 of the circuit pattern layer 20 and electrically connecting the other electrode of the supplemental repair element 40 to the first circuit line L1 of the circuit pattern layer 20, and the new circuit connection is configured to replace the old circuit connection, which is constructed by electrically connecting one electrode of the micro photoelectric element 30' to the second circuit line L2 of the circuit pattern layer 20 and electrically connecting the other electrode of the micro photoelectric element 30' to the first circuit line L1 of the circuit pattern layer 20. In addition, the circuit corresponding to the repair position Pr can be formed in the circuit design before the repairing procedure or formed in the following process after detecting out the defective connection position Pc'. The details thereof will be described hereinafter. As mentioned above, this embodiment can configure a supplemental repair element 40 aside the selected micro photoelectric element and then laser weld the supplemental repair element 40. Accordingly, this embodiment can provide the supplemental repair element 40 (good and new micro photoelectric element) to replace the defective product (the micro photoelectric element 30') without damaging the other good micro photoelectric elements 30 around the micro photoelectric element 30'. Therefore, this embodiment can be effectively, efficiently and widely applied to repair the photoelectric device mainly composed of micro photoelectric elements, and the cost for repairing is obviously controllable. Moreover, during the laser welding step, the light can be gathered and irradiated from any surface (e.g. the surface S1 or S2) toward another surface (e.g. the surface S2 or S1), and the gathered light can be further defined as light amplification by stimulated emission of radiation with various wavelengths, such as an IR light or a UV light. Accordingly, when the target substrate 10 is made of the material that allows the invisible light such as the IR light or UV light to pass through, the orientation of the light provided in the laser welding step is not limited. To be noted, the laser welding will cause slight carbonization or blackening at the welding spot due to high temperature, resulting in a visually identifiable low reflectivity. Therefore, the connection part of the circuit pattern layer 20 and the supplemental repair element 40 (by laser welding) can be defined with a reflectivity less than 20%. Generally, the reflectivity of the electrode, which is not processed by welding, may be as high as 80%. The reflectivity of the aforementioned connection part may also be between 10% and 20%, or even lower than 10%. To be noted, although these micro photoelectric elements (including defective micro photoelectric elements 30') are transferred to the target substrate 10 through different types of huge-amount transfer step, all these micro photoelectric elements (including defective micro photoelectric elements 30') are electrically connected to the target substrate 10 through a thermal effect method (or other means). Therefore, a plurality of preset micro photoelectric elements 30 and 30' are connected to the welding parts of the target substrate 10 due to heating and melting electrodes (i.e. thermal effect) or other means. Compared with the carbonization or blackening at the welding parts caused by high-power laser welding of the selected supplemental repair element 40, the reflectivity is still visually distinguishable. It should be noted that even if the plurality of preset micro photoelectric elements 30 and 30' are formed by other means, there are still opportunities to distinguish them through vision. The details thereof will be described later.

Second Embodiment

Figure 1B:
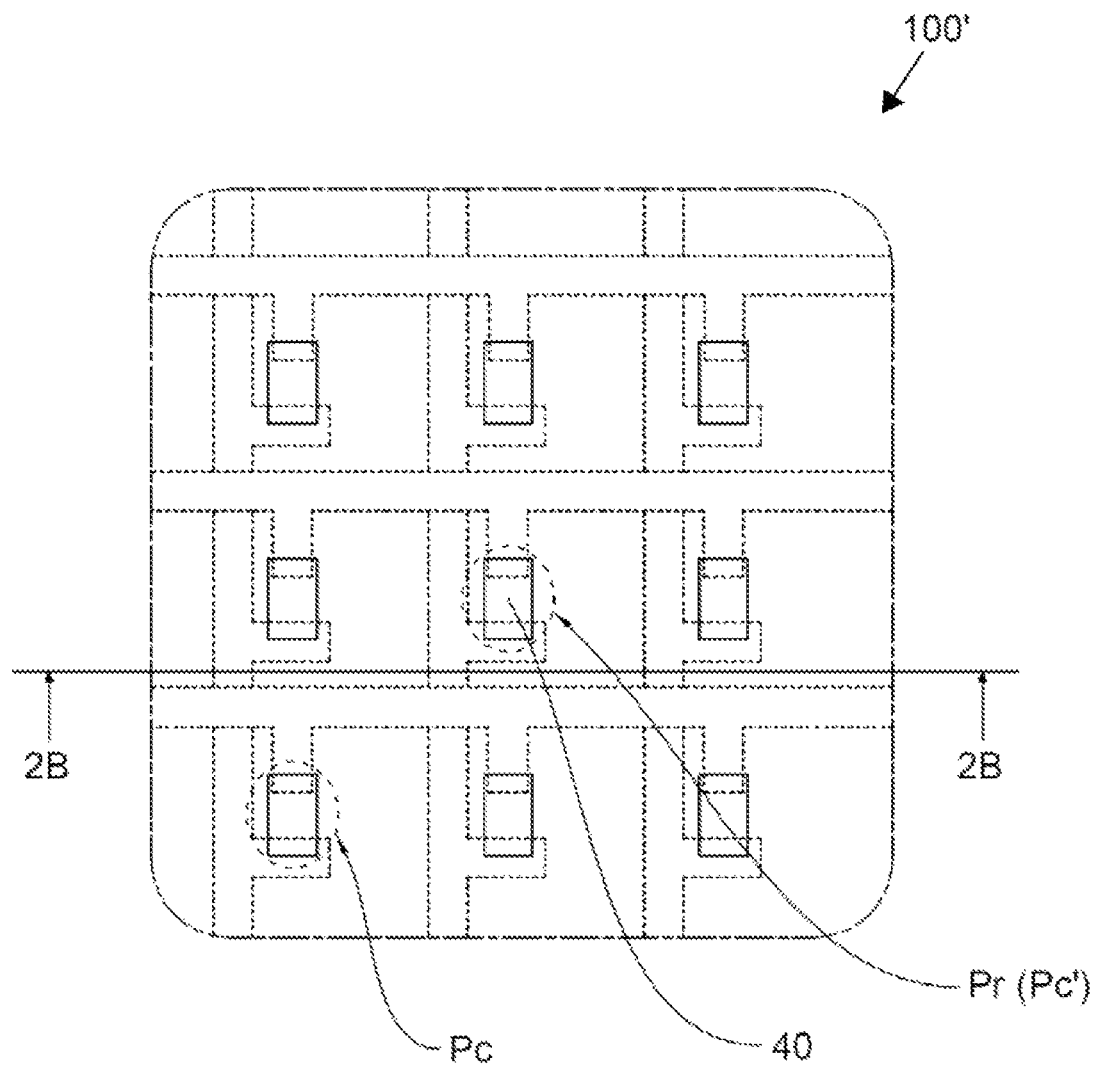
FIG. 1B is a schematic diagram showing a photoelectric device according to a second embodiment of this disclosure.
Figure 2B:
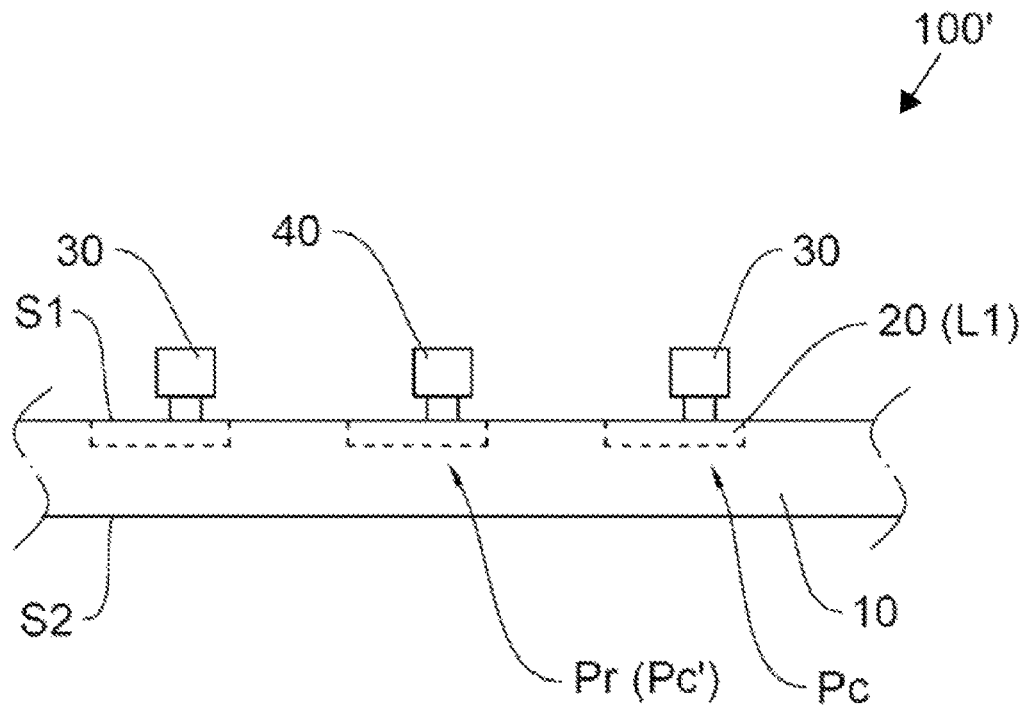
FIG. 2B is a side view of FIG. 1B.

FIGS. 1B and 2B are schematic diagrams showing a photoelectric device according to a second embodiment of this disclosure. Referring to FIGS. 1B and 2B, similar to the photoelectric device 100, the photoelectric device 100' comprises a target substrate 10, a circuit pattern layer 20, a plurality of micro photoelectric elements, and a supplemental repair element 40. Different from the photoelectric device 100, the offset D in the photoelectric device 100' is equal to zero. That is, the repair position Pr is identical to the connection position Pc', and the supplemental repair element 40 replaces the micro photoelectric element 30' and is disposed on the repair position Pr. This configuration can also provide a new circuit connection between the supplemental repair element 40 and the circuit pattern layer 20 to replace the old circuit connection. The micro photoelectric element 30' can be removed from the connection position Pc' by laser, and the supplemental repair element 40 is welded to the connection position Pc' (the repair position Pr) of the circuit pattern layer 20 by laser welding before or after the removing process. In this embodiment, the supplemental repair element 40 and the micro photoelectric elements (including the defective micro photoelectric element 30') can together form a part of the matrix array.

Third Embodiment

The third embodiment comprises the features of the first and second embodiments. In the third embodiment, the offset D is greater than zero, the defective micro photoelectric element 30' can be removed, and the supplemental repair element 40 is disposed on the repair position Pr aside the connection position Pc'. Since the supplemental repair element 40 is disposed aside the defective micro photoelectric element 30', so the supplemental repair element 40 is not involved in the matrix array of the regularly arranged micro photoelectric elements (including the defective micro photoelectric element 30').

Fourth Embodiment

Similar to the second embodiment, in the fourth embodiment, the offset D is equal to zero, and the defective connection position Pc' of the target substrate 10 is a blank connection position Pc, which is not filled with any micro photoelectric element 30 or 30' initially. Since the offset D is equal to zero, the repair position Pr is identical to the connection position Pc'. In this embodiment, the supplemental repair element 40 can be directly disposed on the repair position Pr, and the step of removing the defective product is not needed.

In the first to fourth embodiments, the electrode of the supplemental repair element 40 is welded to the circuit pattern layer 20 by laser welding, and the part processed by the laser welding can be distinguished from the other micro photoelectric elements 30, which are not processed by the laser welding. For example, the welding part can be defined with a reflectivity less than 20%, which is sufficient for visual distinguishing.

Fifth Embodiment

Figure 5:
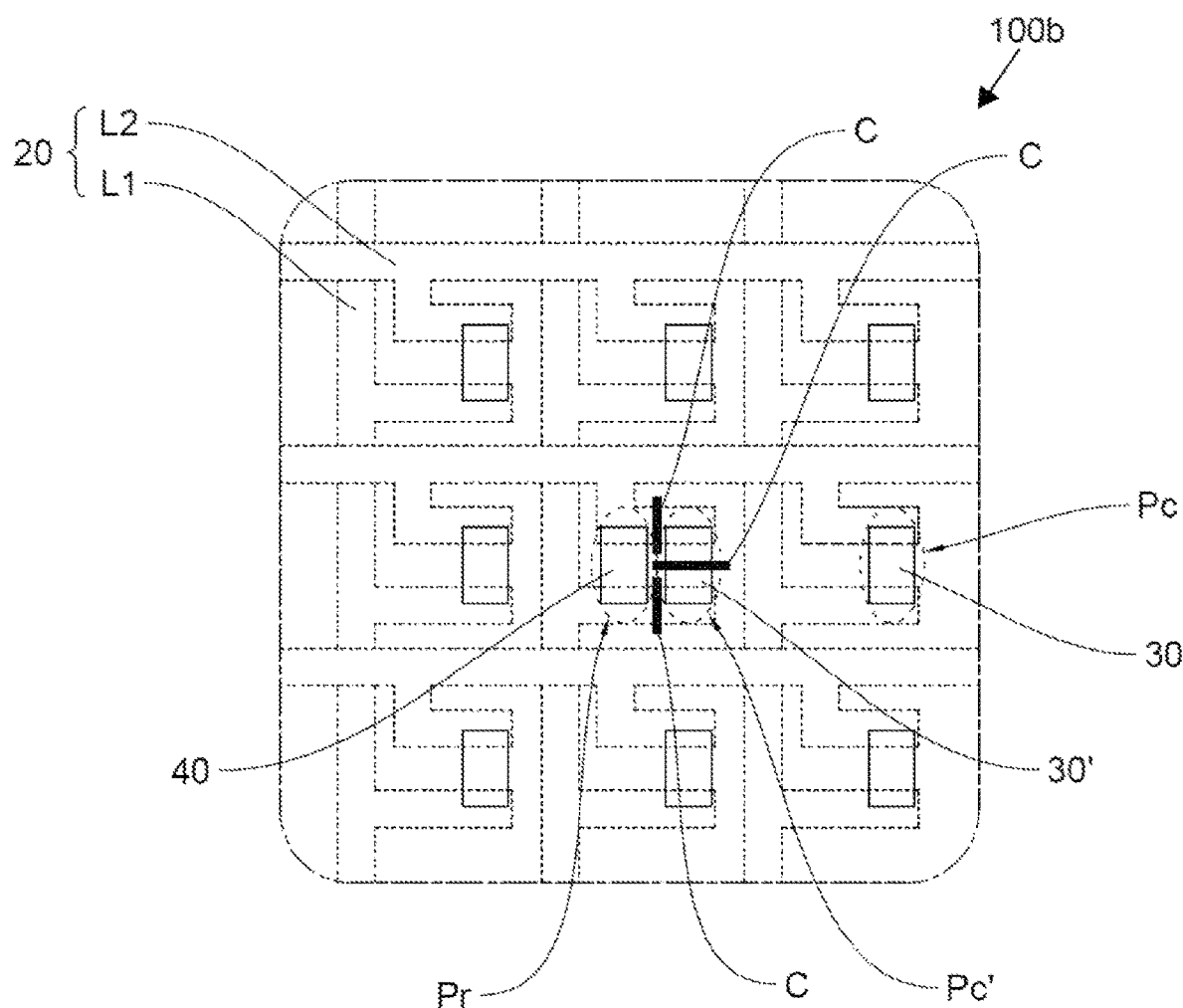
FIG. 5 is a schematic diagram showing a photoelectric device according to a fifth embodiment of this disclosure.

FIG. 5 is a schematic diagram showing a photoelectric device according to a fifth embodiment of this disclosure. Referring to FIG. 5, similar to the photoelectric device 100, the photoelectric device 100a comprises a target substrate 10, a circuit pattern layer 20, a plurality of micro photoelectric elements 30 (30'), and a supplemental repair element 40. Different from the photoelectric device 100, the first circuit lines L1 and the second circuit lines L2 of the circuit pattern layer 20 have a design such that the micro photoelectric elements 30 (30') can be positioned at the ends of the extension segments of the first circuit lines L1 and the second circuit lines L2. In this case, the supplemental repair element 40 disposed aside the defective micro photoelectric element 30' is located away from the ends of the extension segments of the first circuit lines L1 and the second circuit lines L2 farther than the defective micro photoelectric element 30'. Before or after disposing the supplemental repair element 40, a cutting line C is formed on the part of the circuit pattern layer 20 adjacent to the micro photoelectric element 30' (e.g. the extension segment of the first or second circuit line L1 or L2) by laser cutting, or is formed across the entire micro photoelectric element 30' for damaging the structure or function of the micro photoelectric element 30'. Obviously, on the target substrate 10, the relative positions between the connection positions Pc (corresponding to the micro photoelectric element 30') and the repair position Pc (corresponding to the supplemental repair element 40) can have various configurations, and this disclosure is not limited thereto.

Sixth Embodiment

Figure 6A:
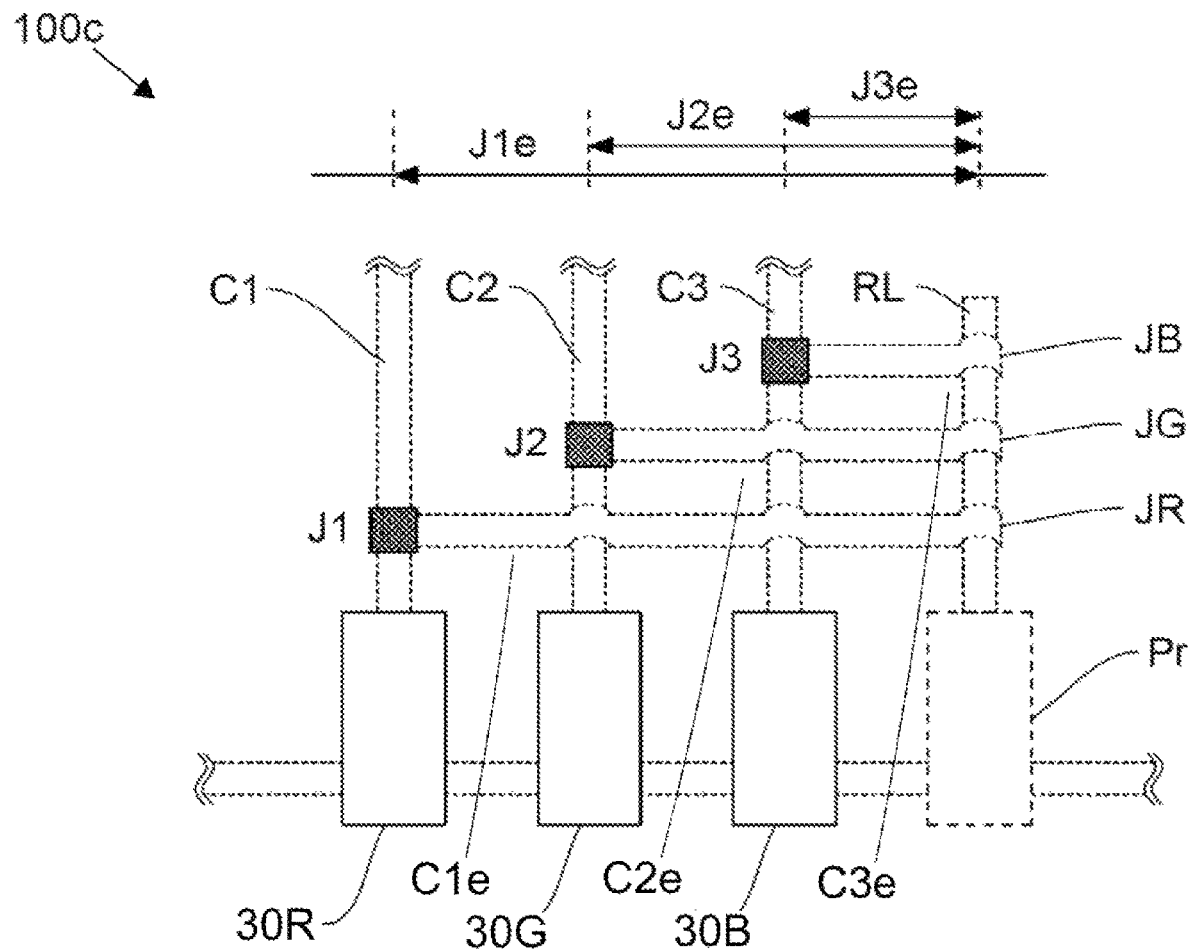
FIGS. 6A and 6B are different schematic diagrams showing a photoelectric device according to a sixth embodiment of this disclosure.
Figure 6B:
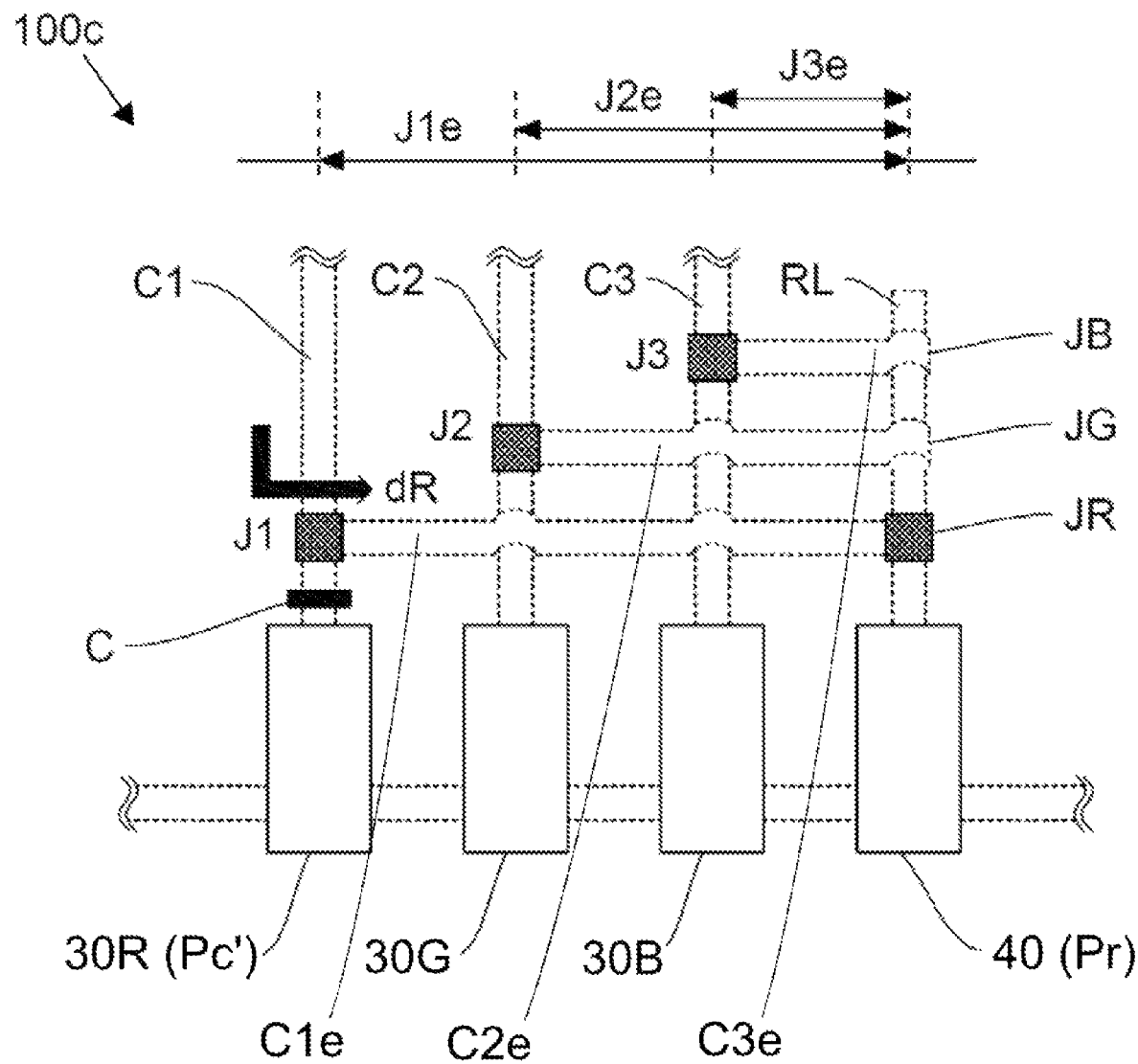

FIGS. 6A and 6B are different schematic diagrams showing a photoelectric device according to a sixth embodiment of this disclosure. As shown in FIG. 6A, similar to the photoelectric device 100, the photoelectric device 100c comprises a target substrate 10, a circuit pattern layer 20, a plurality of micro photoelectric element groups, and at least one supplemental repair element 40. Each of the micro photoelectric element group at least comprises a red micro photoelectric element 30R, a green micro photoelectric element 30G, and a micro photoelectric element 30B. In this embodiment, for example, one electrode of each micro photoelectric element 30R, 30G or 30B is electrically connected to the circuit line C1, C2 or C3 in the circuit pattern layer 20, and the other electrode thereof is a common electrode. The target substrate 10 is configured with a plurality of connection position groups arranged in a matrix and a repair position Pr, which is disposed adjacent to the corresponding connection position group with an offset with relative to the corresponding connection position group. In more detailed, each connection position group at least comprises the connection positions Pc for the corresponding red micro photoelectric element 30R, the green micro photoelectric element 30G, and the blue micro photoelectric element 30B, and the repair position Pr is disposed with an offset with relative to the entire corresponding connection position group. The detailed description thereof will be discussed later. In this embodiment, the three connection positions Pc of each connection position group, which are disposed corresponding to three micro photoelectric elements 30R, 30G and 30B of the corresponding micro photoelectric element group, and the repair position Pr corresponding to the corresponding connection position group can together construct a pixel unit. A plurality of pixel units are regularly arranged in a matrix array, thereby forming the display area of the photoelectric device 100c of this embodiment. The micro photoelectric elements 30R, 30G and 30B of this embodiment are arranged in a row, but this disclosure is not limited thereto. In addition, the number of the repair position Pr can be more than one.

The structure of the pixel unit of this embodiment will be described hereinafter. Each connection position group comprises three connection positions Pc corresponding to three micro photoelectric elements 30R, 30G and 30B. The repair position Pr has an offset DR with relative to the red micro photoelectric element 30R, an offset DG with relative to the green micro photoelectric element 30G, and an offset DB with relative to the blue micro photoelectric element 30B. As shown in FIG. 6A, the circuit lines C1, C2 and C3 of the circuit pattern layer 20 further comprise the circuit extension segments C1e, C2e and C3e, respectively. The circuit extension segments C1e, C2e and C3e are extended from the circuit lines C1, C2 and C3, respectively, and are electrically connected to the circuit lines C1 C2 and C3, respectively, through the corresponding conducting portions J1, J2 and J3. As a result, the circuit lines C1, C2 and C3 comprise the circuit extension segments C1e, C2e and C3e, respectively, for electrically connecting outwardly. The circuit pattern layer 20 is further configured with a repair line RL, which is disposed corresponding to the circuit extension segments C1e, C2e and C3e, and is electrically isolated with the circuit extension segments C1e, C2e and C3e. As shown in FIGS. 6A and 6B, the circuit extension segments C1e, C2e and C3e can be individually cross with the repair line RL at a junction port Jr, a junction port JG, a junction port JB, respectively. In this case, within the junction ports JR, JG and JB, the repair line RL and the circuit extension segments C1e, C2e and C3e are in non-connection. Herein, the term "non-connection" means that the two objects are not electrically connected with each other. Therefore, one electrode of the red micro photoelectric element 30R, one electrode of the green micro photoelectric element 30G, one electrode of the blue micro photoelectric element 30B, and one electrode of the supplemental repair element 40 are electrically connected with each other, and the other electrodes thereof are connected to the corresponding circuit lines C1, C2 and C3, and the repair line RL. According to this configuration, the circuit connection between the circuit pattern layer 20 and the other electrode of the red micro photoelectric element 30R can be replaced by the circuit connection between the circuit pattern layer 20 and the other electrode of the supplemental repair element 40. To be noted, each of the red micro photoelectric element 30R, the green micro photoelectric element 30G, the blue micro photoelectric element 30B, and the supplemental repair element 40 comprises, for example, two electrodes, but this disclosure is not limited thereto. In different embodiment, any of the above-mentioned micro photoelectric elements can comprise two or more electrodes, and the scope of this disclosure should comprise any aspect as long as one electrode of the supplemental repair element is electrically connected to one of the micro photoelectric element, and one electrode of the supplemental repair element and one electrode of the corresponding micro photoelectric element are electrically connected to the corresponding circuit lines, respectively.

As shown in FIG. 6B, when the red micro photoelectric element 30R is a defective product, the supplemental repair element 40, which is a good red micro photoelectric element, is selected and disposed on the repair position Pr of the target substrate 10. By the laser welding process, the supplemental repair element 40 can be welded and connected to the circuit pattern layer 20, and the part of the repair line RL within the junction port JR can also be melted so as to electrically connect the circuit extension segment C1e to the repair line RL. Since one electrode of the supplemental repair element 40 has been electrically connected to the red micro photoelectric element 30R (or the green micro photoelectric element 30G, or the blue micro photoelectric element 30B), the circuit connection between the other electrode thereof and the circuit line C1 in the circuit pattern layer 20 (as shown by the arrow dR) can be established through the repair line RL, the junction port JR and the circuit extension segment C1e for replacing the circuit connection between the other electrode of the red micro photoelectric element 30R and the circuit line C1 in the circuit pattern layer 20. To be noted, the other non-welded junction ports JB and JG are still in the non-connection status (no circuit connection). In addition, the welded junction port JR can be the welding point of the supplemental repair element 40, which has a reflectivity less than 20%. A cutting line C can be formed across the circuit line C1 of the circuit pattern layer 20, which is disposed adjacent to the electrode of the red micro photoelectric element 30R for interrupting the electrical connection between the circuit pattern layer 20 and the electrode of the red micro photoelectric element 30R.

In brief, the photoelectric device 100c of this embodiment comprises a target substrate 10, a circuit pattern layer 20, a plurality of micro photoelectric element groups electrically connected to the circuit pattern layer 20, and at least one supplemental repair element 40 disposed adjacent to at least one of the micro photoelectric element groups. Each micro photoelectric element group at least comprises a red micro photoelectric element 30R, a green micro photoelectric element 30G, and a blue micro photoelectric element 30B. The at least one supplemental repair element 40 is electrically connected to the circuit pattern layer 20. One electrode of the red micro photoelectric element 30R, one electrode of the green micro photoelectric element 30G, one electrode of the blue micro photoelectric element 30B, and one electrode of the supplemental repair element 40 are electrically connected with each other (electrically connected in common), and the repair line RL is electrically connected to the circuit extension segment C1e for establishing the circuit connection between the circuit pattern layer 20 and the other electrode of the at least one supplemental repair element 40. A cutting line C is formed on a part of the circuit pattern layer 20, which is located aside the other electrode of the micro photoelectric element 30R of the corresponding at least one micro photoelectric element group. Accordingly, the circuit connection between the circuit pattern layer 20 and the at least one supplemental element 40 can replace the circuit connection between the circuit pattern layer 20 and the micro photoelectric element 30R of the corresponding at least one micro photoelectric element group. Moreover, the cutting line C can be defined between the conducting portion J1 and the micro photoelectric element 30R. The amount of the supplemental repair elements and the corresponding micro photoelectric elements are not limited in this disclosure, and the same technical effect can be achieved through any technical means equal to that of this disclosure.

Seventh Embodiment

Figure 7A:
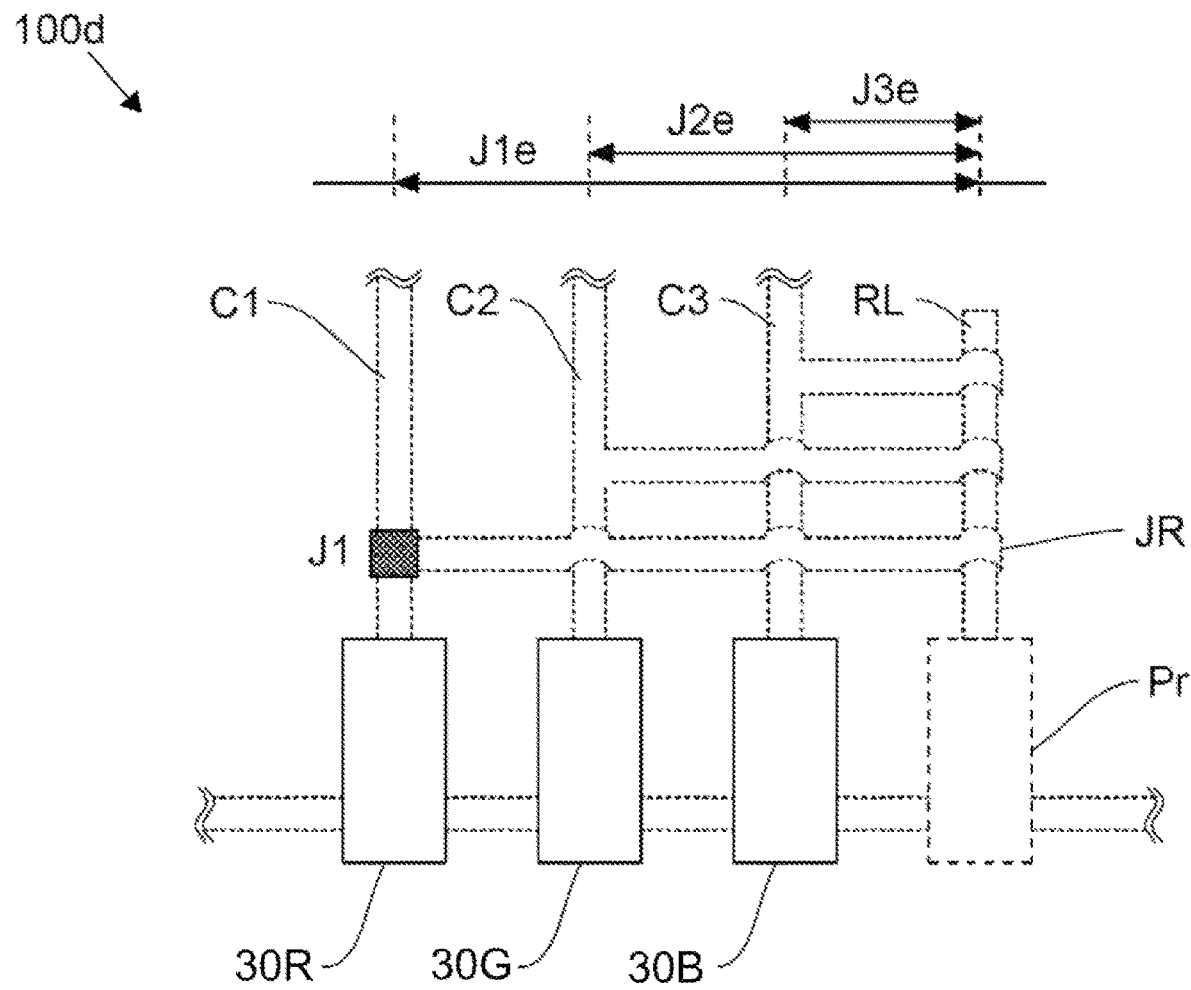
FIGS. 7A and 7B are different schematic diagrams showing a photoelectric device according to a seventh embodiment of this disclosure.
Figure 7B:
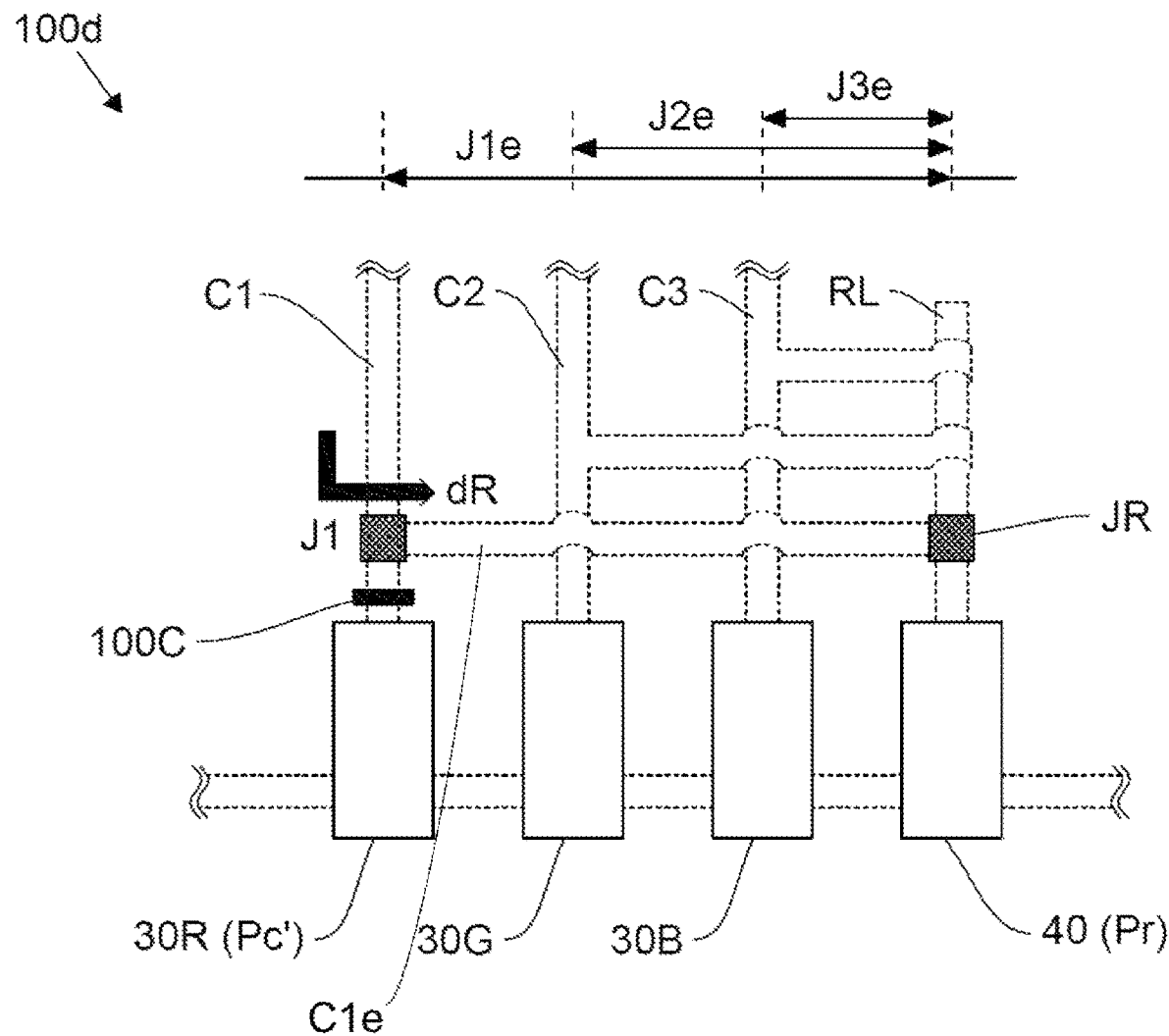

Similar to the first embodiment, the repair position Pr of this disclosure can be formed after detecting out the defective connection position Pc'. In other words, the circuit and/or the conducting pad of the corresponding repair position Pr can be formed in the post manufacturing processes. With reference to FIGS. 7A and 7B, similar to the sixth embodiment, a photoelectric device 100d comprises a target substrate 10, a circuit pattern layer 20, a plurality of micro photoelectric element groups electrically connected to the circuit pattern layer 20, and at least one supplemental repair element 40. Each of the micro photoelectric element group at least comprises a red micro photoelectric element 30R, a green micro photoelectric element 30G, and a micro photoelectric element 30B. In this embodiment, for example, one electrode of each micro photoelectric element 30R, 30G or 30B is electrically connected to the circuit line C1, C2 or C3 in the circuit pattern layer 20, and the other electrode thereof is a common electrode in the circuit pattern layer 20. The target substrate 10 is configured with a plurality of connection position groups arranged in a matrix and a repair position Pr, which is disposed adjacent to the corresponding connection position group with an offset with relative to the corresponding connection position group. Each connection position group comprises three connection positions Pc corresponding to three micro photoelectric elements 30R, 30G and 30B. The repair position Pr has an offset DR with relative to the red micro photoelectric element 30R, an offset DG with relative to the green micro photoelectric element 30G, and an offset DB with relative to the blue micro photoelectric element 30B. Each of the red micro photoelectric element 30R, the green micro photoelectric element 30G, the blue micro photoelectric element 30B, and the supplemental repair element 40 comprises, for example, two electrodes.

Different from the sixth embodiment, as shown in FIG. 7A, the circuit lines C1, C2 and C3 of the circuit pattern layer 20 do not comprise the corresponding circuit extension segments C1e, C2e and C3e, and the conducting portions J1, J2 and J3. In addition, the circuit pattern layer 20 comprises a repair line RL, which is electrically isolated from the circuit lines C1 C2 and C3, but does not comprise the junction ports JR, JG and JB. After detecting out the defective connection position Pc' or the defective product 30R, the target substrate 10 is disposed within an operation chamber filled with organometallic gas, and a laser is provided to induce metal deposition so as to form the structure as shown in FIG. 7B (only applied to the circuit extension segment C1e and the conducting portion J1 corresponding to the red micro photoelectric element 30R). Furthermore, the laser is further applied to the junction port JR located at the cross portion of the repair line RL and the circuit extension segment C1 to form the circuit connection between the repair line RL and the circuit extension segment C1. Optionally, the laser can be further applied to form a cutting line C on a part of the circuit pattern layer 20 between the conducting portion J1 and the red micro photoelectric element 30R. In addition, if the circuit extension segment C1e and the conducting portion J1 can be formed in the post processes, the repair line RL can also be formed after detecting out the defective connection position Pc' or the defective product 30R.

Eighth Embodiment

Different from any of the above-mentioned first to seventh embodiments, in the eighth embodiment, the micro photoelectric elements 30 and 30' are electrically connected to the circuit pattern layer 20 on the target substrate 10 by laser welding, and the supplemental repair element 40 is electrically connected to the circuit pattern layer 20 by thermal effect. In this embodiment, the welding points of the micro photoelectric elements 30 and 30' formed by the laser welding have a reflectivity less than 20%, but the supplemental repair element 40 does not. Obviously, with respect to the circuit pattern layer 20, the carbonization or blackening at the welding points caused by laser welding of the photoelectric elements 30 and 30' is also visually distinguishable.

Ninth Embodiment

Corresponding to the first to third embodiments and the fifth to seventh embodiments, in the ninth embodiment, the micro photoelectric elements 30 and 30' are electrically connected to the circuit pattern layer 20 on the target substrate 10 by laser welding, and the supplemental repair element 40 is also electrically connected to the circuit pattern layer 20 by laser welding. In this embodiment, since the offset D of the supplemental repair element 40 with relative to the micro photoelectric element 30' is greater than zero, it is still visually distinguishable.

Tenth Embodiment

Corresponding to the first to third embodiments and the fifth to seventh embodiments, in the tenth embodiment, the micro photoelectric elements 30 and 30' are electrically connected to the circuit pattern layer 20 on the target substrate 10 by thermal effect, and the supplemental repair element 40 is also electrically connected to the circuit pattern layer 20 by thermal effect. In this embodiment, since the offset D of the supplemental repair element 40 with relative to the micro photoelectric element 30' is greater than zero, it is still visually distinguishable.

Eleventh Embodiment

FIGS. 8 and 9A to 9E are a flow chart and schematic diagrams thereof showing the repair method for a photoelectric device according to the first embodiment as shown in FIGS. 3, 3A, 4A and 4B.

Figure 3:
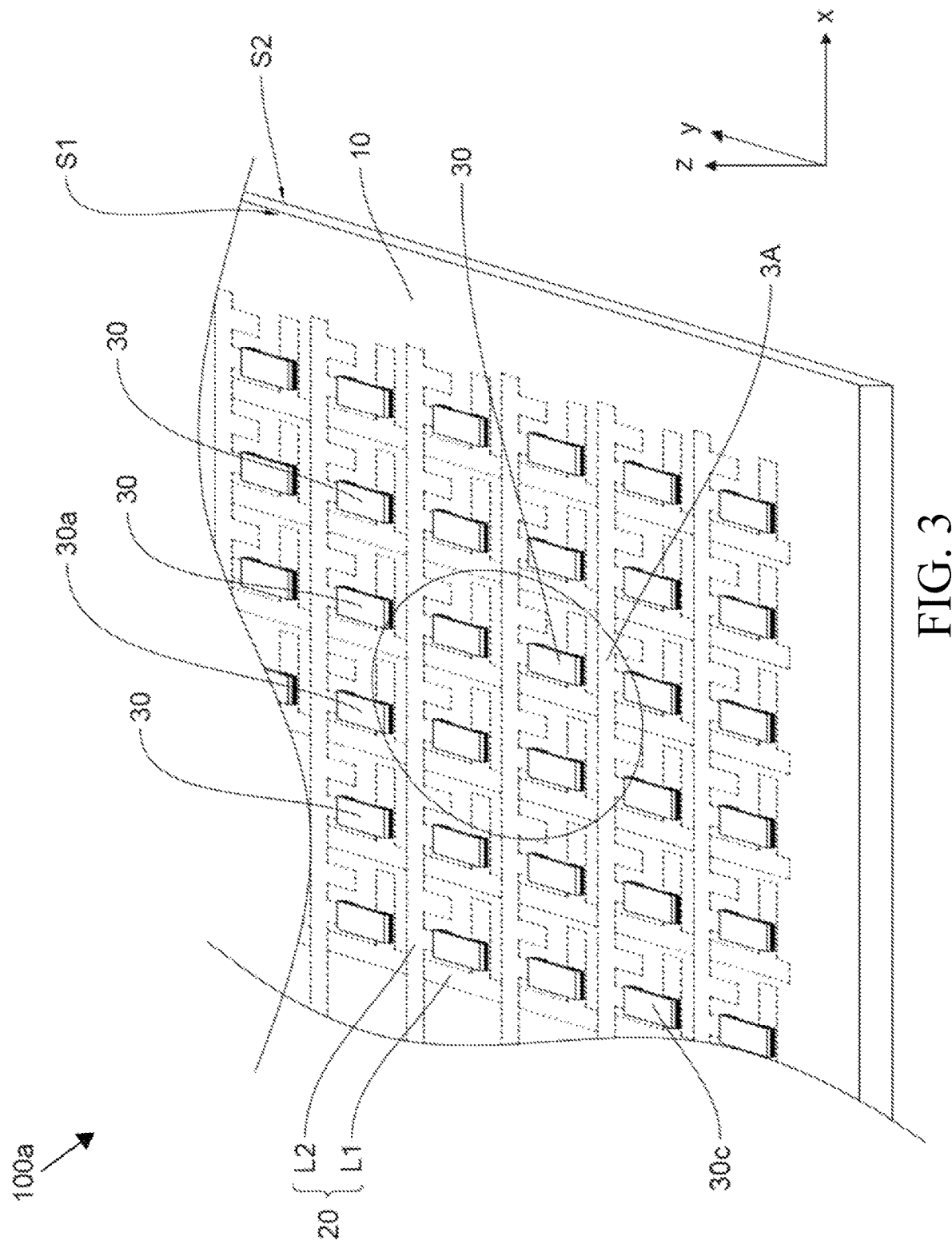
FIG. 3 is a schematic diagram of the first embodiment.

FIG. 3 shows a part of a photoelectric device 100a, which comprises a target substrate 10, a circuit pattern layer 20 disposed on the target substrate 10, and a plurality of micro photoelectric elements 30 electrically connected to the circuit pattern layer 20. The target substrate 10 has two surfaces S1 and S2. The target substrate 10 is defined with a plurality of regularly arranged connection positions Pc, and a repair position Pr, which is disposed with an offset D with relative to at least a corresponding one of the connection positions Pc. The circuit pattern layer 20 at least comprises a plurality of first circuit lines L1, a plurality of second circuit lines L2, and a plurality of extension segments extending from the first circuit segments L1 and the second circuit segments L2, respectively. Each micro photoelectric element at least comprises two electrodes, which are disposed corresponding to and electrically connecting to the first circuit line L1 and the second circuit line L2 of the circuit pattern layer 20. In this embodiment, the connection positions Pc are arranged in a matrix array including M rows and N columns, wherein N and M are at least greater than 1, and N can be equal to M. The micro photoelectric elements are disposed on at least a part of the connection positions Pc on the target substrate 10.

To be noted, the target substrate 10 comprises a plurality of normal connection positions Pc and at least one defective connection position Pc', which is randomly and irregularly distributed in the plurality of normal connection positions Pc. Herein, the normal connection positions Pc are configured with the good micro photoelectric elements 30 (also referred to good products hereinafter), and the defective connection position Pc' is blank (no micro photoelectric element 30 or 30' is filled) or is configured with the defective micro photoelectric element (also referred to defective product). In this embodiment, multiple defective products 30a, 30b and 30c are shown. The above-mentioned defective products 30a, 30b and 30c can be determined by setting different conditions or acceptance criteria according to various characteristics as described in the first embodiment, while the good products 30 are defined with relative to the defective products 30a, 30b and 30c. This embodiment is for an illustration but not to limit this disclosure.

To be noted, the repair position Pr can be preserved while manufacturing (the circuit pattern layer 20 of) the target substrate 10, and/or the conducting pads for electrical connections can be preserved at the same time. Optionally, after detecting out the defective connection positions Pc', the target substrate 10 can be disposed in an operation chamber filled with organometallic gas for forming the extension segment of the repair position Pr and/or the conducting pads thereof by laser deposition. Accordingly, the repair position Pr can be formed in the pre-process before the repair step, or be formed in the post process after detecting out the defective connection position Pc'. In other words, the repair position Pr can be configured not only for the defective connection position Pc', but also for all of the preset connection positions PC.

Figure 3A:
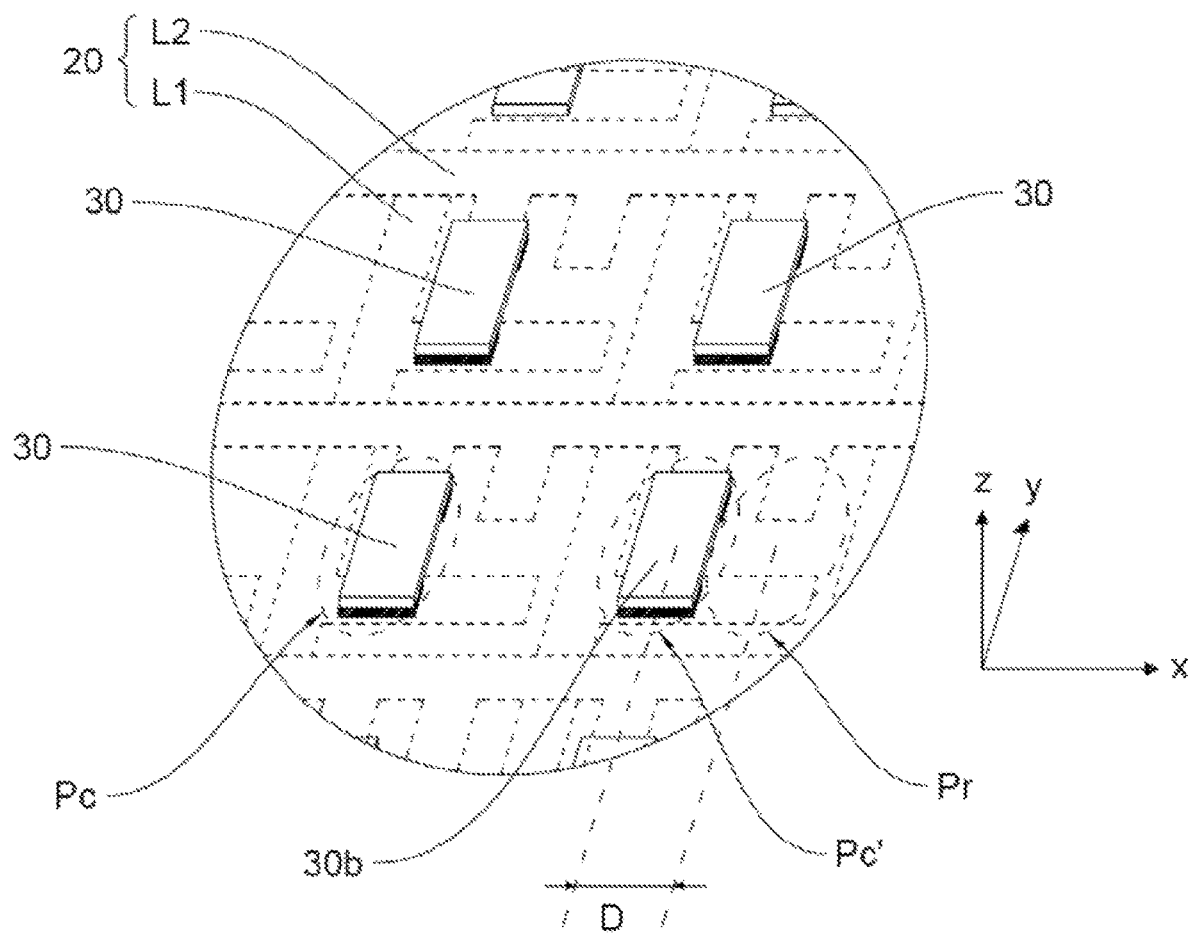
FIG. 3A is a partial enlarged view of FIG. 3.

FIG. 3A is a partial enlarged view of FIG. 3, and shows a 2×2 micro photoelectric element array, which comprises a defective product 30b and other good products 30. To easier understanding, the parts of the target substrate 10 corresponding to the good products 30 are labeled as the connection positions Pc, and the part thereof corresponding to the defective product 30b is labeled as the connection position Pc'. In addition, the target substrate 10 further comprises a repair position Pr with an offset D with relative to the connection position Pc'.

Figure 4A:
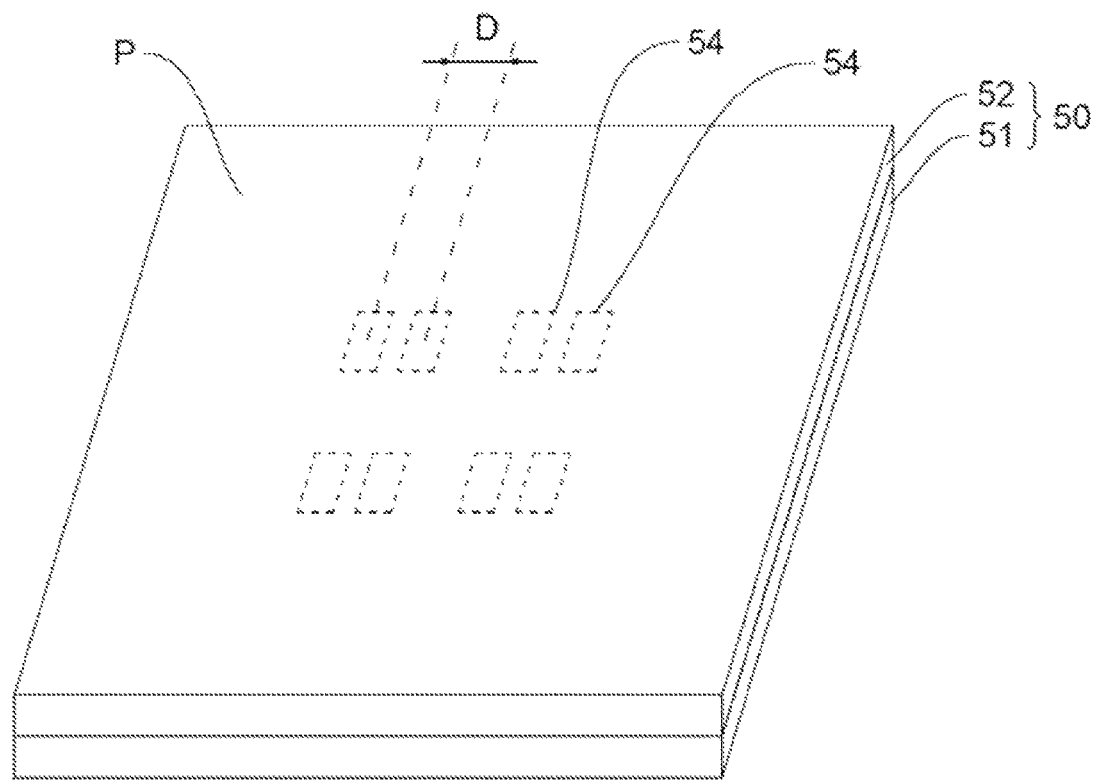
FIGS. 4A and 4B are different schematic diagrams of the transfer device.
Figure 4B:
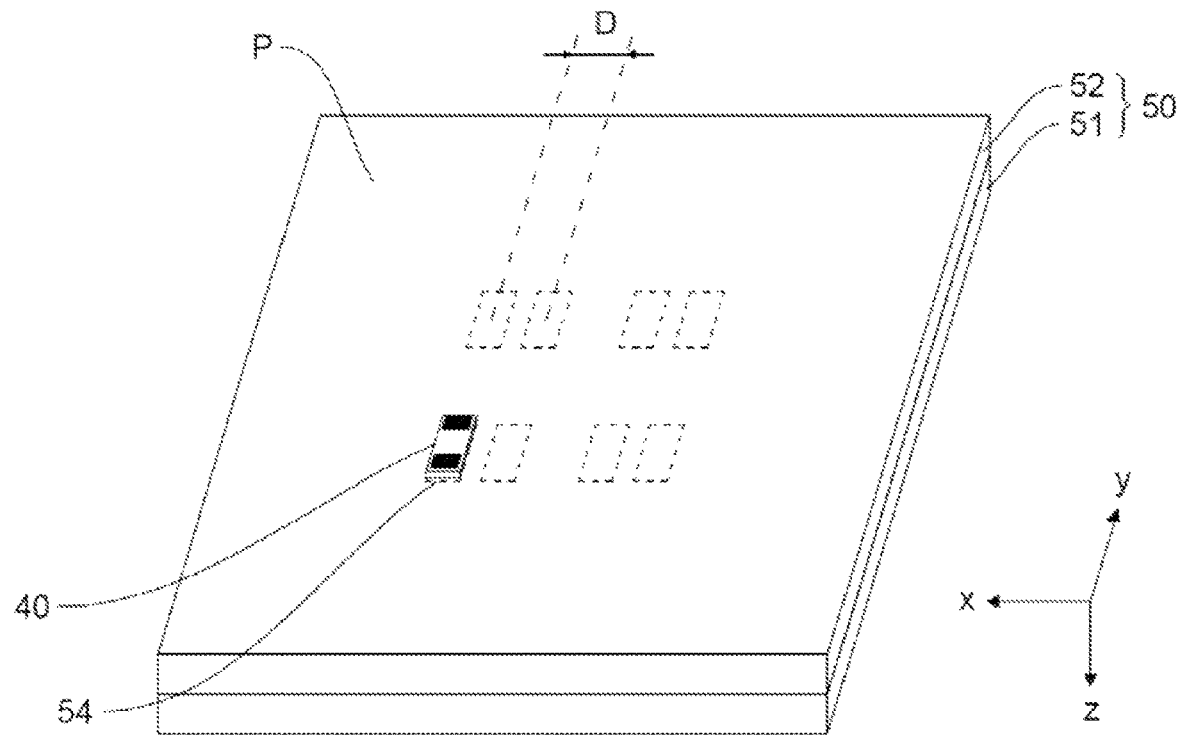

FIGS. 4A and 4B are schematic diagrams showing the transfer device 50 before and after picking up the supplemental repair element 40, respectively. The transfer device 50 of this disclosure relates to a pending TW Patent Application No. 107142782, entitled "OPTOELECTRONIC SEMICONDUCTOR STAMP AND MANUFACTURING METHOD THEREOF, AND OPTOELECTRONIC SEMICONDUCTOR DEVICE", all of them and this application belong to the same owner, and all contents equivalent to the patent application are incorporated herein by reference. For sake of easier illustration, the transfer device 50 corresponds to the target substrate 10 of FIG. 3A, and the dimension thereof is equivalent to the area of the target substrate 10 as shown in FIG. 3A. The transfer device 50 comprises a transfer substrate 51 and a buffer material 52 disposed on the transfer substrate 51. The transfer substrate 51 has a certain hardness for supporting the buffer material 52 to planar contact and press a plurality of micro photoelectric elements on the target substrate 10. The buffer material 52 is made of a material with the shock absorption and buffering functions, such as silicone gel, for preventing the damage applied to the above-mentioned micro photoelectric elements. The buffer material 52 comprises a pressing plane P, which is configured to further increase the accuracy and precision in transferring the supplemental repair element 40. To be noted, each of the micro photoelectric elements (including the good products 30 and the defective product 30') and the supplemental repair element 40 is defined with a height of at least 5 μm. The term "at least" comprises the range of "greater than" and "equal to". Since the heights of the micro photoelectric elements disposed on the target substrate 10 are not even, the buffer material 52 is configured with a thickness of at least 4 μm for compensating the height difference between the highest micro photoelectric element and the lowest micro photoelectric element. For example, when the transfer device 50 transfers the supplemental repair element 40 to the target substrate 10, which is configured with the good products 30 and the defective product 30' in advance, the buffer material 52 may contact a part of the good products 30 and the defective product 30' as the transfer device 50 approaches the target substrate 10. Since the buffer material 52 has the properties of shock absorption and buffering, it may not damage the preset structures on the target substrate 10 (e.g. the good products 30 and the defective product 30') after the contact. Accordingly, the transfer device 50 can achieve the function of transferring the supplemental repair element 40 without damaging the circuit structures or other good products 30 around the defective product 30'.

For easier understanding, as shown in FIG. 4A, a plurality of stamp positions 54 can be defined on the press plane P of the transfer device 50. The stamp positions 54 may at least match the connection positions Pc and Pc' corresponding to the good products 30 and the defective product 30b on the target substrate 10, respectively, or may directly match the repair positions Pc corresponding to the defective connection positions Pc' (i.e. not match the connection positions Pc corresponding to the good products), or may match a part of the defective connection positions Pc' and a part of the repair positions Pr corresponding to the defective products.

Figure 8:
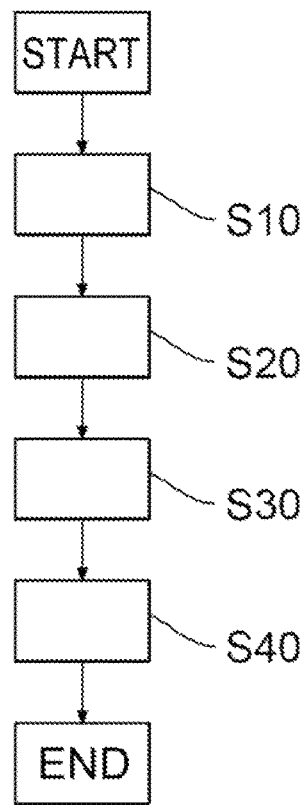
FIG. 8 is a schematic diagram showing the procedure of the first embodiment.

FIG. 8 is a flow chart of this embodiment, and FIGS. 9A to 9E are side views showing the repairing procedure of the photoelectric device 100a based on FIG. 3A. As shown in FIG. 8, the repair method of a photoelectric device of this embodiment at least comprises a step S10, a step S20, a step S30, and a step S40.

Figure 9A:
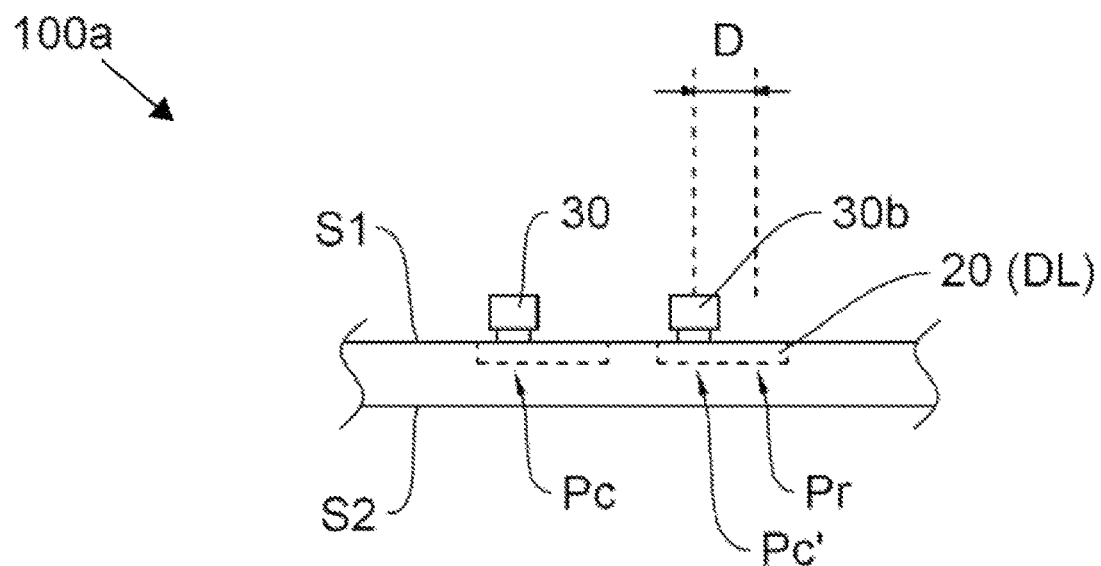
FIGS. 9A to 9E are schematic diagrams showing the manufacturing of the first embodiment.
Figure 9B:
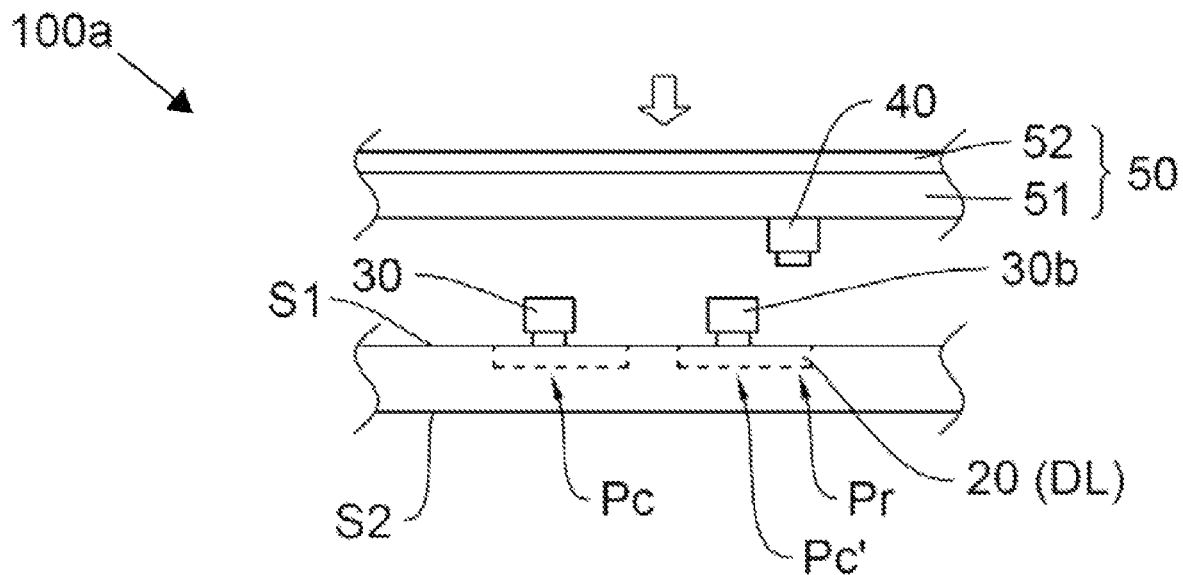
Figure 9C:
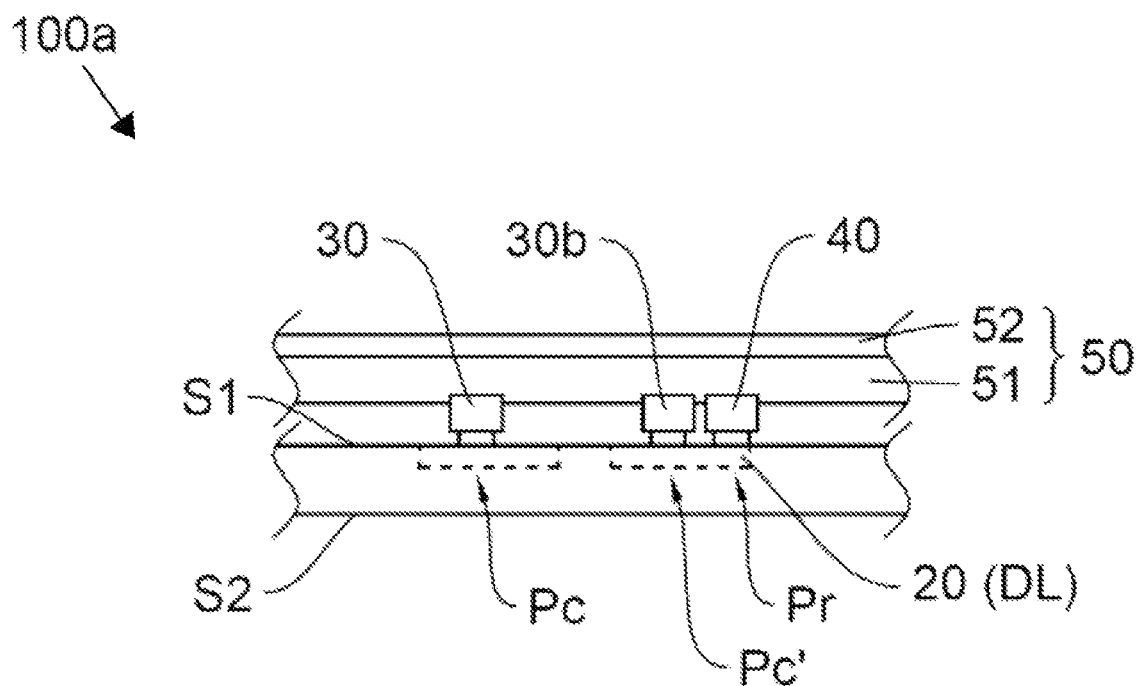

The step S10 is to select one of the micro photoelectric elements. Referring to FIGS. 3A and 9A, the step S10 of selecting one of the micro photoelectric elements is to select a defective product 30b from the micro photoelectric elements disposed on the target substrate 20, or to select a blank on the target substrate 20, thereby determining the defective connection position Pc', and the repair position Pr according to the defective connection position Pc'.

In more detailed, the selected micro photoelectric element corresponds to the above-mentioned defective product 30b or a connection position Pc', which is not filled with any of the micro photoelectric elements 30 and 30'.

The step S20 is to pick up the supplemental repair element 40 and transfer it to the repair position Pr of the target substrate 10 by a transfer device 50. FIG. 4A shows the configuration before the transfer device 50 picks up the supplemental repair element 40, and FIG. 4B shows the configuration after the transfer device 50 picked up the supplemental repair element 40, wherein the supplemental repair element 40 is disposed at one of the stamp positions 54.

In this embodiment, the supplemental repair element 40 is a flip-chip structure, and comprises two electrodes disposed at one side of the supplemental repair element 40 away from the press plane P. To be noted, the supplemental repair element 40 can be picked up by the transfer device 50 from a native substrate or a non-native substrate, and this disclosure is not limited. As shown in FIG. 4B, after the transfer device 50 picked up the supplemental repair element 40, the transfer device 50 and the target substrate 10 as shown in FIG. 3A approach each other (see FIG. 9B) until the supplemental repair element 40 contacts the repair position Pr on the target substrate 10 (see FIG. 9C).

Figure 9D:
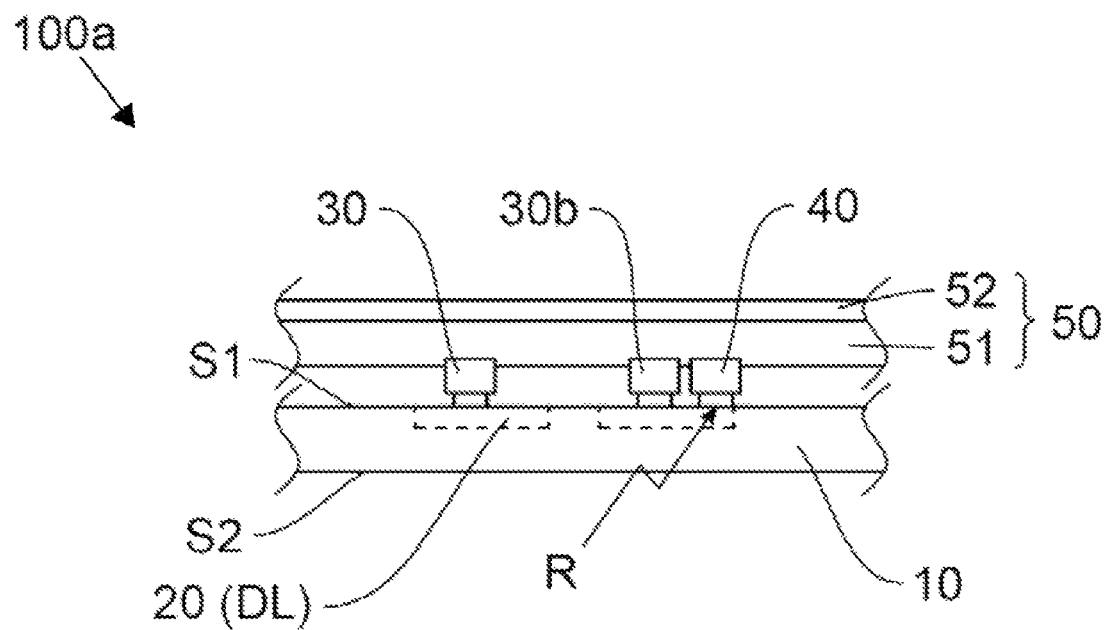

As shown in FIG. 9D, the step S30 is to keep a part of the good products 30 and the identified defective product 30' on the target substrate 10 contacted by the transfer device 50, thereby moving the supplemental repair element 40 to a position corresponding to the repair position Pr, and to irradiate at the repair position Pr corresponding to the supplemental repair element 40, thereby welding two electrodes of the supplemental repair element 40 to electrically connect to the first circuit line L1 and the second circuit line L2 of the circuit pattern layer 20 of the target substrate 10, respectively.

In this disclosure, the size of the transfer device 50 can be equal to or less than the size of the target substrate 10. In this embodiment, the size of the transfer device 50 is less than the size of the target substrate 10. Accordingly, when the transfer device 50 continuously presses the target substrate 10, the pressed micro photoelectric elements comprise a part of the good products 30 and a part of the defective products 30'.

In this embodiment, the irradiating step is to irradiate a high-power IR laser R from the surface S2 of the target substrate 10 to the two electrodes of the supplemental repair element 40 so as to perform the welding process.

Figure 9E:
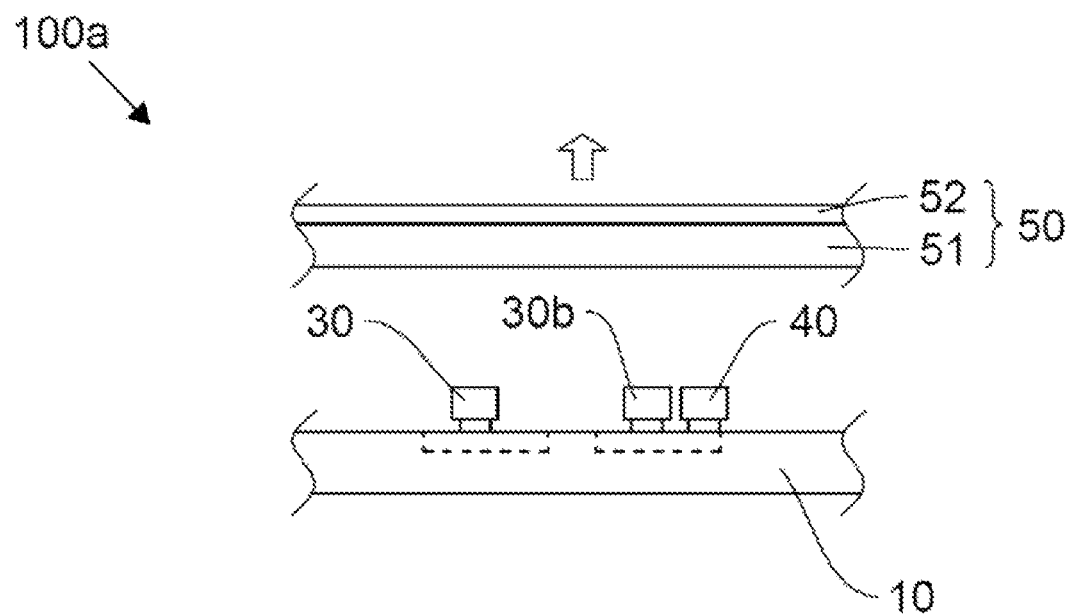

As shown in FIG. 9E, the step S40 is to remove the transfer device 50. Specifically, since the supplemental repair element 40 has been welded to the circuit pattern layer 20 of the target substrate 10, it can be firmly connected to the target substrate 10, and is not moved or damaged in the step S40 of removing the transfer device 50.

To be noted, the steps of this embodiment are one of the examples of this disclosure, and in this embodiment, the offset D is greater than zero. In practice, the offset D can be zero or not, and the defective product can be removed or not. All of these conditions are involved and equivalent to the steps of this embodiment.

In addition, when the offset D is greater than zero, the supplemental repair element 40 can be picked up by the stamp position 54 with an offset, or the supplemental repair element 40 can be picked up by the stamp position 54 without an offset, and then the transfer device 50 moves based on the offset D.

Moreover, this embodiment may create two modes, wherein one mode is based on that the offset D is greater than zero, and the other mode is based on that the offset D is equal to zero. In practice, this embodiment may select one of the modes before the repairing process, or determine the selected mode during the repairing process.

In addition, the repair position Pr can be defined based on all of the connection positions Pc, or based on the defective connection position Pc' only.

In addition, one or both of the target substrate 10 and the transfer device 50 can be made of the invisible-light-permeable material, which allows IR and/or UV light to pass through, and the laser R can be applied from one of the surfaces S1 and S2 of the target substrate 10 to the two electrodes of the supplemental repair element 40 so as to perform the welding process.

Figure 10:
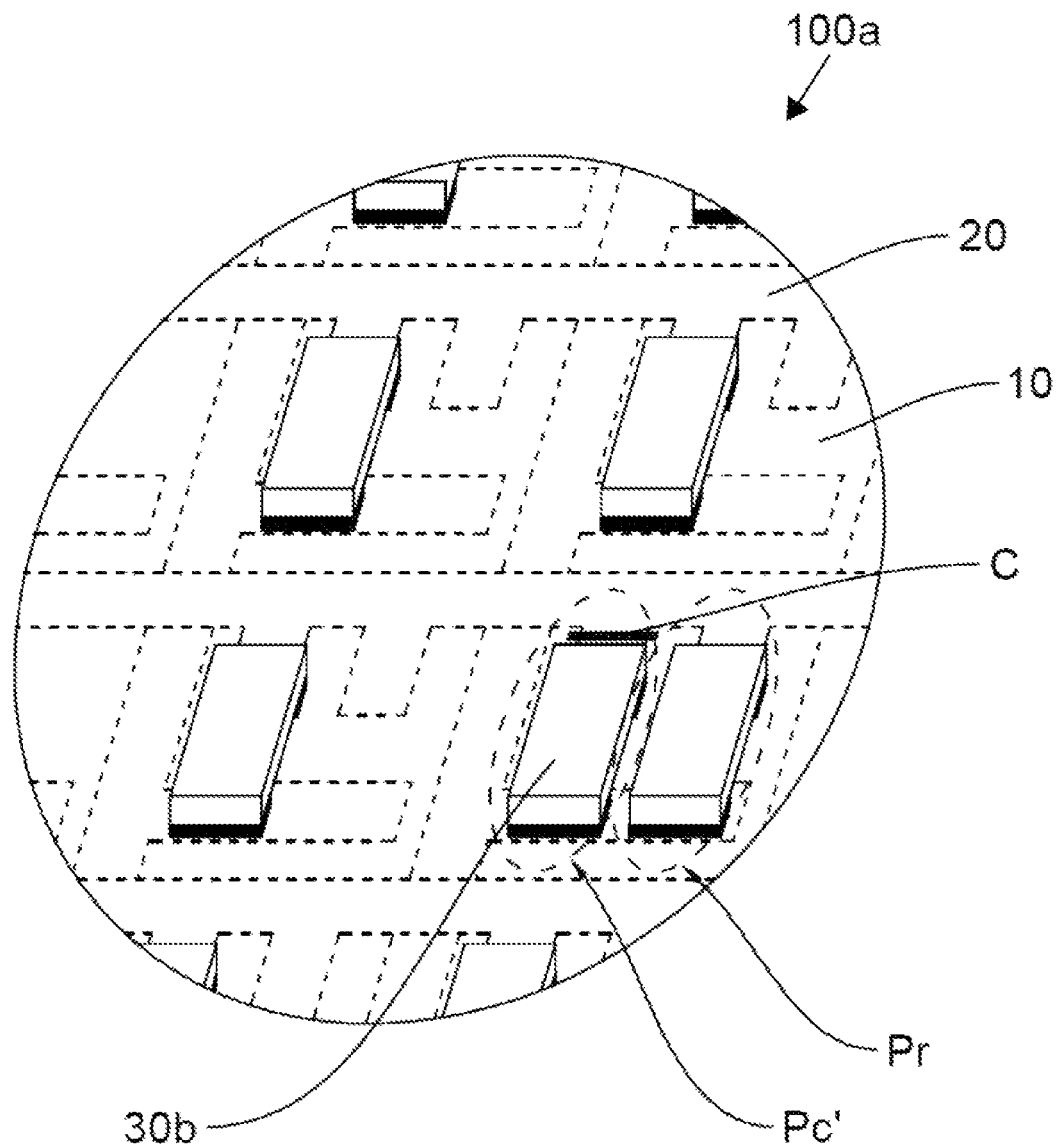
FIG. 10 is another schematic diagram of the first embodiment.

In addition, before or after the laser welding process, as shown in FIG. 10, a cutting line C can be formed at a part of the circuit pattern layer 20 close to the connection position Pc', or the entire defective product 30', or the defective product 30' can be directly removed, thereby interrupting the circuit connection between the circuit pattern layer 20 and the defective product 30'.

When there are multiple supplemental repair elements 40, which means multiple defective products 30' exist, the relative positions of the supplemental repair elements 40 having the same property (e.g. all of them are red micro photoelectric elements) are fixed, so that the stamp positions 54 corresponding to the connection positions Pc' or the repair position Pr can be remained when picking up the supplemental repair elements 40 by the transfer device 50.

Moreover, this embodiment further comprises to form the repair position after detecting out the defective connection position or the defective product.

The above-mentioned aspects are for illustrations only and are not to limit the scope of this disclosure, and the details thereof will be further described hereinafter.

The following twelfth to seventeenth embodiments are the detailed descriptions of the above-mentioned aspects.

Twelfth Embodiment

Figure 11A:
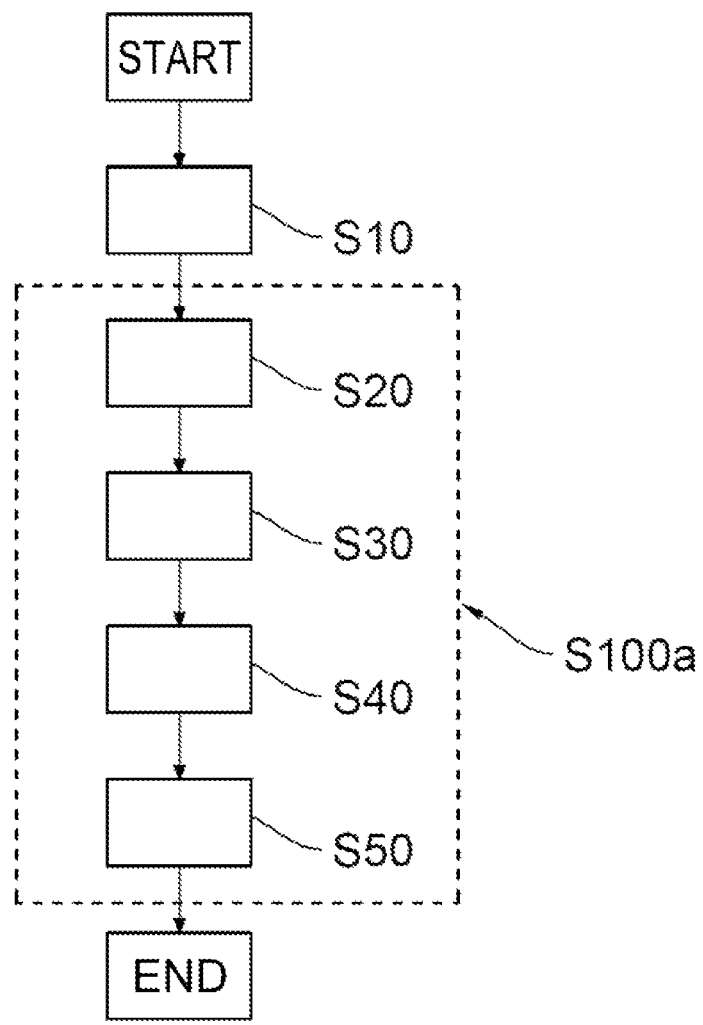
FIGS. 11A to 11E are schematic diagrams showing the procedures of a twelfth embodiment to a sixteenth embodiment.

FIG. 11A is a flow chart of a repair method according to the twelfth embodiment, wherein the offset D is greater than zero. The photoelectric device of this embodiment is similar to the third embodiment, and the repair method of this embodiment is similar to the eleventh embodiment. The repair method of this embodiment at least comprises the following steps S10 to S50. The steps S10 to S40 of the embodiment can be referred to the eleventh embodiment. The step S50 is to form a cutting line C on a part of the circuit pattern layer 20 adjacent to the connection position Pc' for interrupting the circuit connection between the circuit pattern layer 20 and the defective product 30'. Accordingly, the circuit connection between the supplemental repair element 40 and the circuit pattern layer 20 can replace the circuit connection between the circuit pattern layer 20 and the defective product 30'.

To be noted, the procedure of replacing the circuit connection between the circuit pattern layer 20 and the defective product 30' by the circuit connection between the supplemental repair element 40 and the circuit pattern layer 20 can be carried out by the existing design of the circuit pattern layer 20 or any of other suitable methods, and the step S50 of forming the cutting line C is not an essential step. In other words, the suitable methods other than the step of forming the cutting line C should be involved in and equivalent to the scope of the third and eleventh embodiments.

This embodiment defines one step S100a including the steps S20 to S50.

Thirteenth Embodiment

Figure 11B:
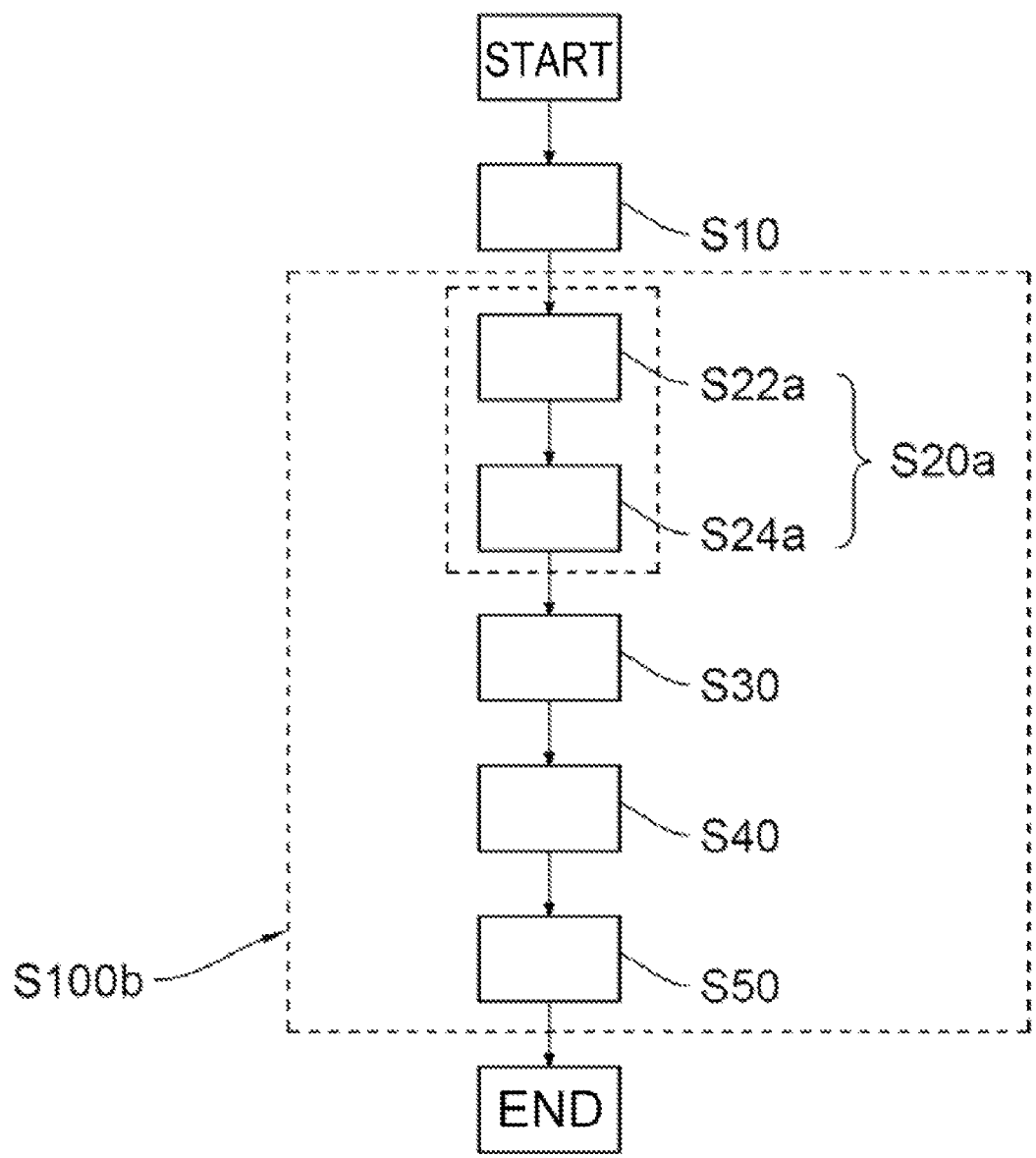

FIG. 11B is a flow chart of a repair method according to the thirteenth embodiment, wherein the offset D is greater than zero. The photoelectric device of this embodiment is similar to the third embodiment, and the repair method of this embodiment is similar to the twelfth embodiment. The repair method of this embodiment at least comprises the following steps S10 to S50. The steps S10, S30, S40 and S50 of the embodiment can be referred to the twelfth embodiment.

The step S20a comprises a step S22a and a step S24a. In the step S22a, the supplemental repair element 40 is located on the stamp position of the transfer device 50, and the stamp position matches the connection position Pc' of the defective product 30' on the target substrate 10. The step 24a is to move the transfer device 50 according to the offset D, thereby correspondingly disposing the supplemental repair element 40 to the repair position Pr of the target substrate 10.

This embodiment defines one step S100b including the steps S20a to S50.

Fourteenth Embodiment

Figure 11C:
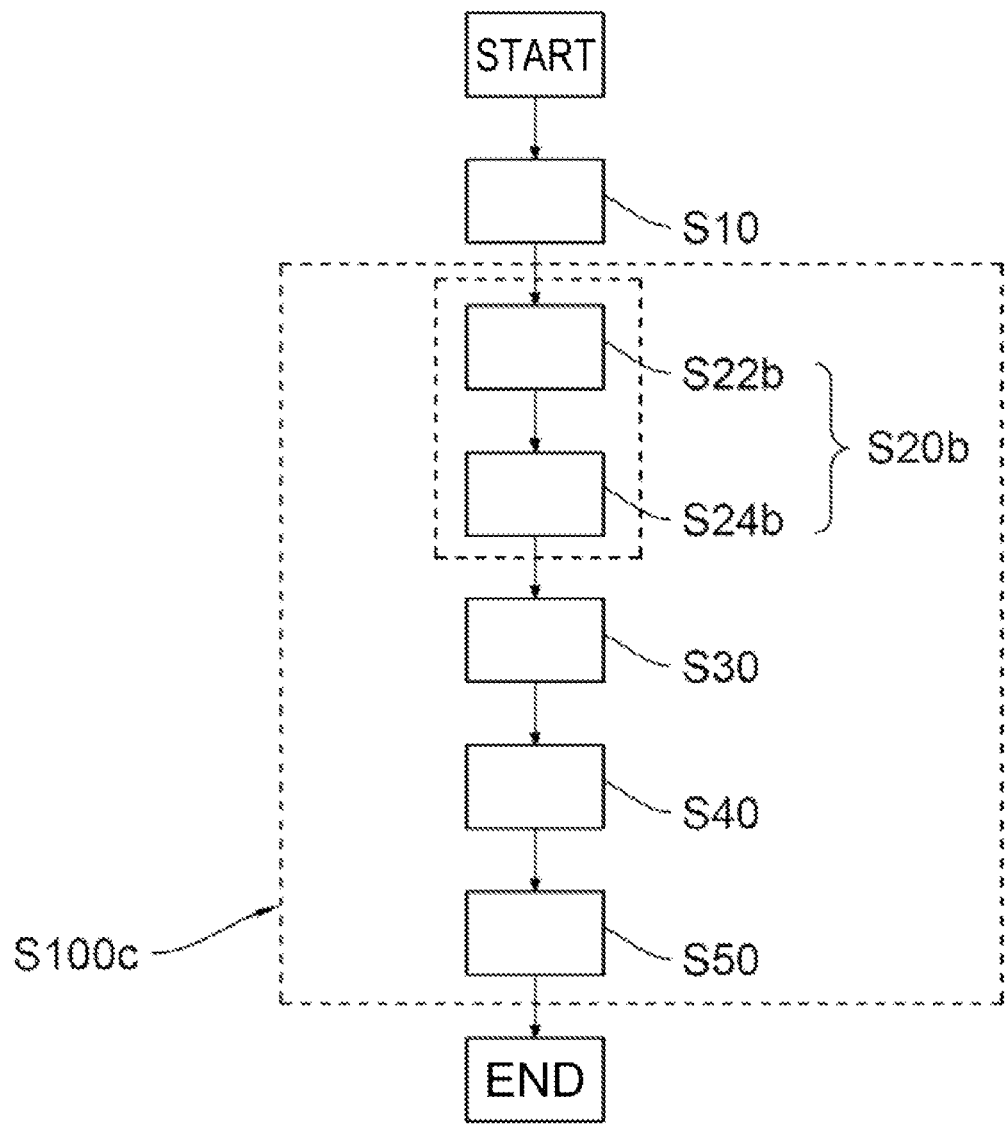

FIG. 11C is a flow chart of a repair method according to the fourteenth embodiment, wherein the offset D is greater than zero. The photoelectric device of this embodiment is similar to the third embodiment, and the repair method of this embodiment is similar to the twelfth embodiment. The repair method of this embodiment at least comprises the following steps S10 to S50. The steps S10, S30, S40 and S50 of the embodiment can be referred to the twelfth embodiment.

The step S20b comprises a step S22b and a step S24b. In the step S22b, the supplemental repair element 40 is located on the stamp position of the transfer device 50, and the stamp position matches the repair position Pr on the target substrate 10. The step 24b is to move the transfer device 50, thereby correspondingly disposing the supplemental repair element 40 to the repair position Pr of the target substrate 10.

This embodiment defines one step S100c including the steps S20b to S50.

Fifteenth Embodiment

Figure 11D:
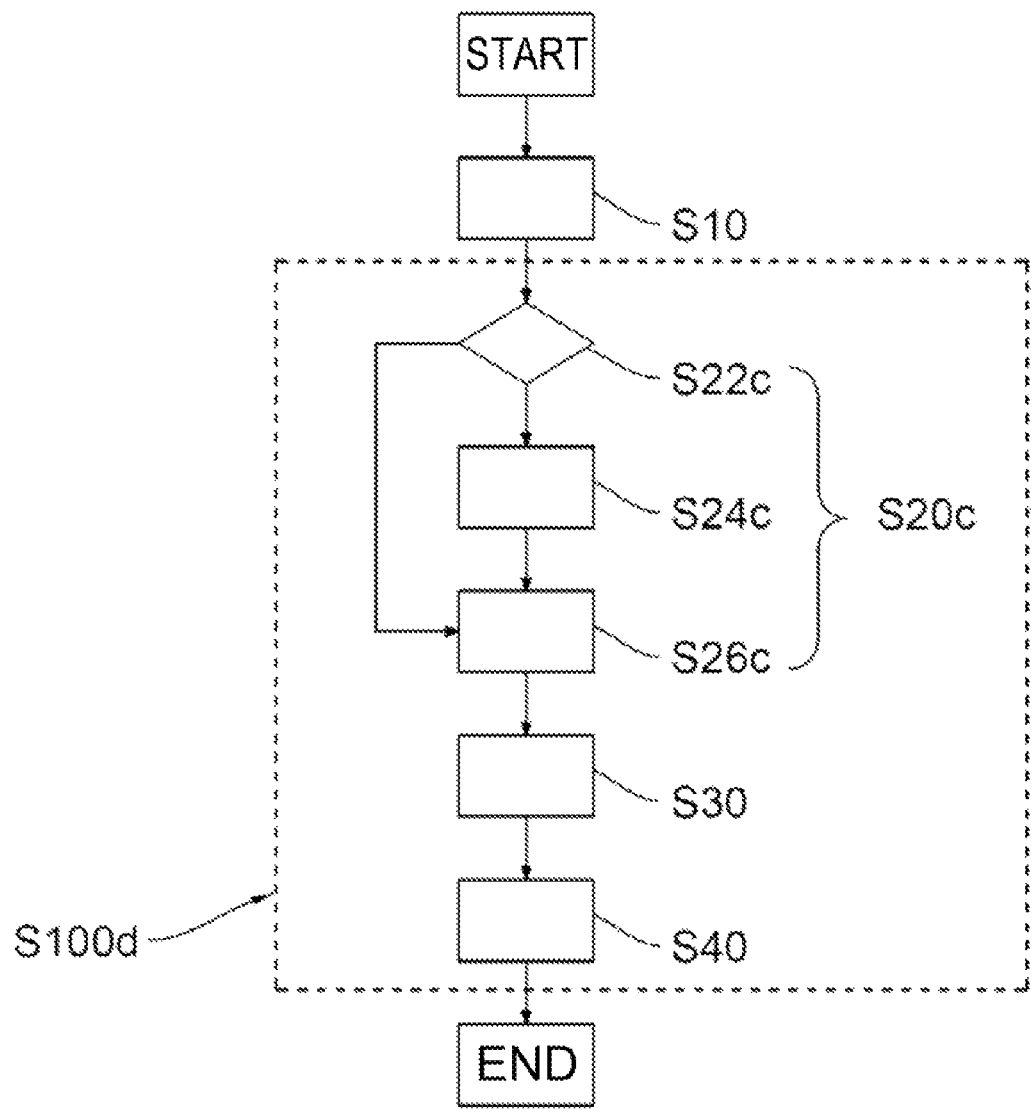

FIG. 11D is a flow chart of a repair method according to the fifteenth embodiment, wherein the offset D is equal to zero (similar to the second and fourth embodiments). The repair method of this embodiment at least comprises the following steps S10 to S40. The steps S10, S30 and S40 of the embodiment can be referred to the eleventh embodiment.

The step S20c comprises a step S22c, a step S24c and a step S26c. The step S22c determines whether to remove the defective product 30' on the target substrate 10. If the step S22c determines to remove the defective product 30', the step S24c is then performed; if the step S22c determines not to remove the defective product 30', the step S26c is then performed. The step S24c is to remove the defective product 30'. The step S26c is to move the transfer device 50, thereby correspondingly disposing the supplemental repair element 40 at the connection position Pc' on the target substrate 10. In this embodiment, the connection position Pc is the repair position Pr.

This embodiment defines one step S100d including the steps S20c to S40.

Sixteenth Embodiment

Figure 11E:
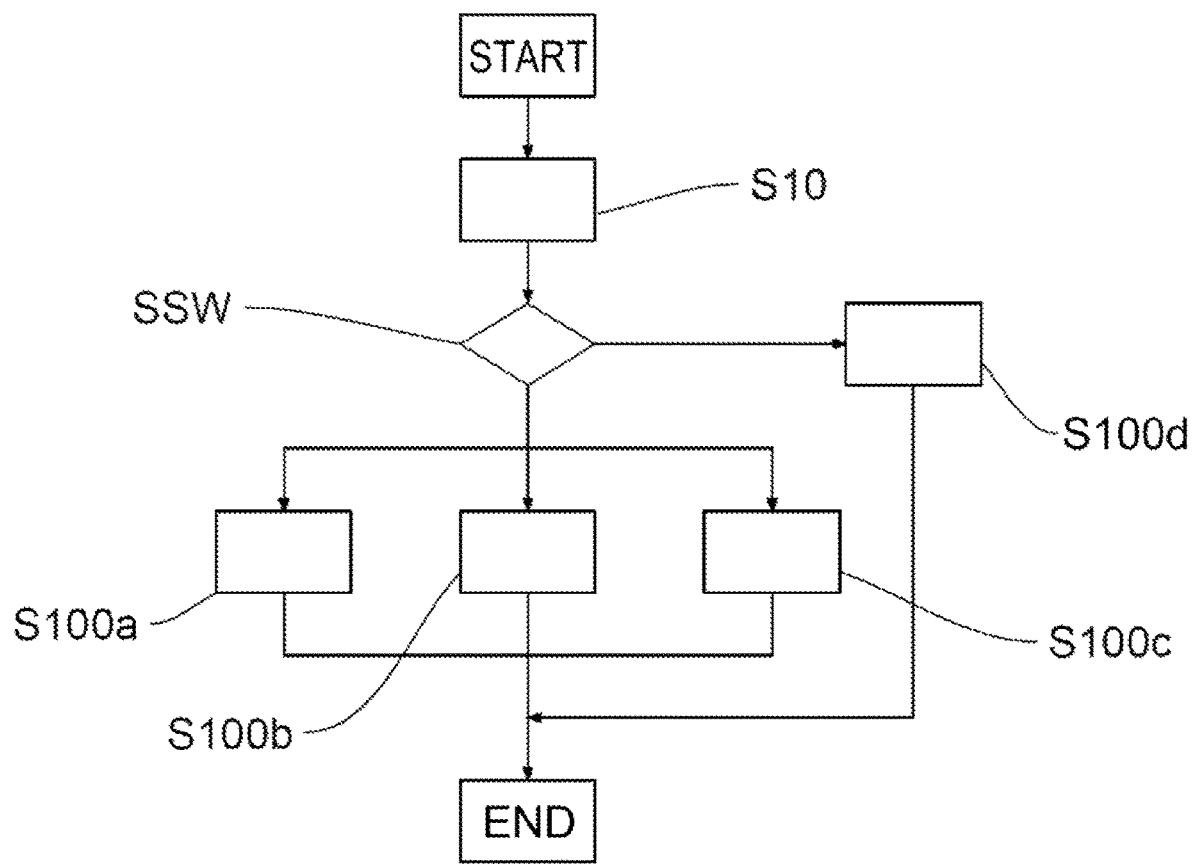

FIG. 11E is a flow chart of a repair method according to the sixteenth embodiment, which combines the above-mentioned repair methods and provides a mode selection. The repair method of this embodiment at least comprises the following steps S10, S100a, S100b, S100c, S100d, and SSW. The step S10 of the embodiment can be referred to the eleventh embodiment. The step SSW is a mode selection step. When the offset is equal to zero, the repair method goes to the step S100d (i.e. the fifteenth embodiment); when the offset is greater than zero, the repair method goes to select one of the step S100a (i.e. the twelfth embodiment), the step S100b (i.e. the thirteenth embodiment), and the step S100c (i.e. the fourteenth embodiment).

This embodiment discloses one of the mode selection methods. To be noted, any method that can utilize any of the above embodiments should be involved in the scope of this embodiment or disclosure.

Seventeenth Embodiment

Figure 12:
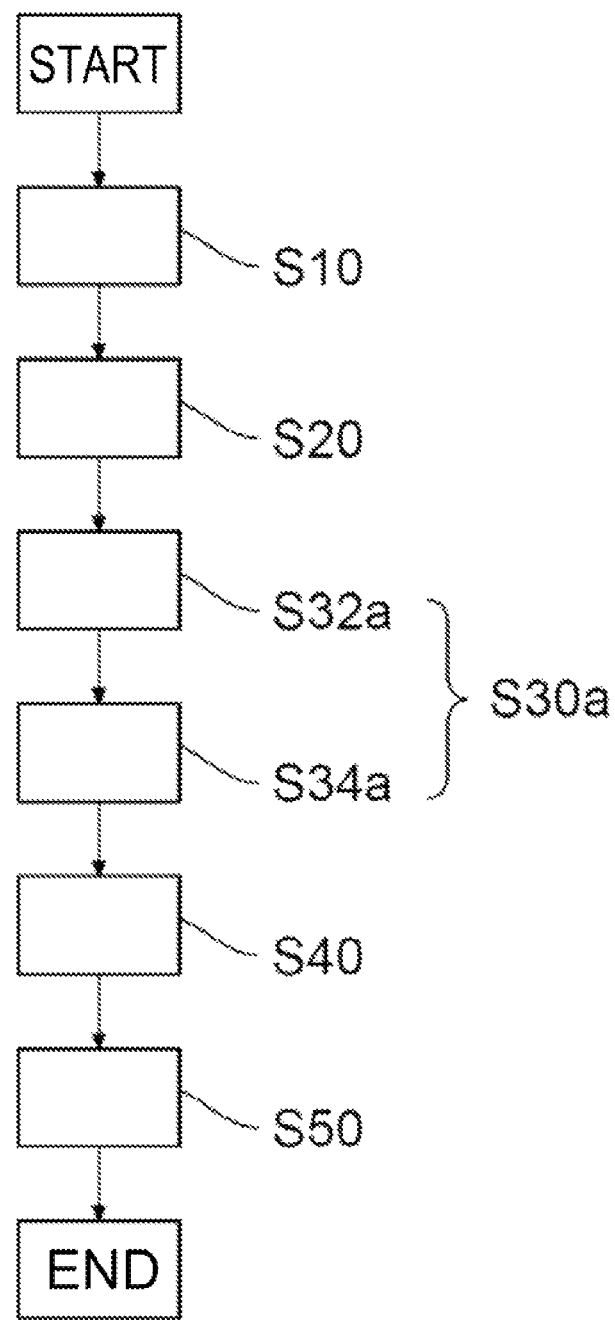
FIG. 12 is a schematic diagram showing the procedure of the seventeenth embodiment.

FIG. 12 is a flow chart of a repair method for the sixth embodiment, wherein the offset D is greater than zero. The repair method of this embodiment comprises the following steps S10, S20, S30a, S40 and S50.

The step S10 is to select one of the micro photoelectric elements 30R, 30G and 30B, thereby determining a defective connection position Pc' on the target substrate 20 from one of the micro photoelectric elements 30R, 30G and 30B. In this embodiment, the red micro photoelectric element 30R is, for example, a defective product. Afterwards, the repair position Pr can be defined based on the connection position Pc' as shown in FIG. 6A. To be noted, the connection position Pc' also comprises the following situations: the connection position is blank, the red micro photoelectric element filled in the connection position is a defective product, or the electrical connection of the red micro photoelectric element is poor although the red micro photoelectric element is a good product.

The step S20 is to pick up the supplemental repair element 40 (another red micro photoelectric element) and transfer it to the repair position Pr of the target substrate 10 by a transfer device 50. As shown in FIG. 6B, the supplemental repair element 40 is located on one of the stamp positions 54. In this embodiment, the supplemental repair element 40 is a flip-chip structure and comprises two electrodes disposed at one side of the supplemental repair element 40 away from the press plane P.

The step S30*a* comprises a step S32*a* and a step S34*a*.

The step S32*a* is to continuously press a part of the micro photoelectric elements 30R, 30G and 30B (including good products and defective products) within a region corresponding to the size of the transfer device 50 by the transfer device 50, and to irradiate the repair position Pr corresponding to the supplemental repair element 40, thereby welding two electrodes of the supplemental repair element 40 to electrically connect to the circuit pattern layer 20 of the target substrate 10, respectively. One electrode of the supplemental repair element 40 is electrically connected to one electrode of the micro photoelectric element 30R, 30G or 30B, and the other electrode of the supplemental repair element 40 is electrically connected to the repair line RL. The irradiating step is to irradiate a high-power (IR) laser R from the surface S2 of the target substrate 10 to the two electrodes of the supplemental repair element 40 so as to perform the welding process.

The step S34*a* is to melt the junction port JR on the repair line RL by laser for electrically connecting the circuit extension segment C1*e* to the repair line RL. Accordingly, the circuit connection between the other electrode of the supplemental repair element 40 and the circuit pattern layer 20 (as shown by the arrow dR) can be established to replace the circuit connection between the other electrode of the red micro photoelectric element 30R and the circuit pattern layer 20.

The step S40 is to remove the transfer device 50.

The step S50 is to form a cutting line C on a part of the circuit pattern layer close to the connection position Pc', or on the entire red micro photoelectric element 30R, or to apply a laser to the red micro photoelectric element 30R for evaporating or exploding the red micro photoelectric element 30R, thereby interrupting the other electrode of the circuit connection between the red micro photoelectric element 30R and the circuit pattern layer 20.

To be noted, the repair method of this disclosure can be applied to any of the above-mentioned embodiments, such as the twelfth to fifteenth embodiments, and/or be applied to one of the selectable modes of the sixteenth embodiment. In addition, the micro photoelectric elements 30 on the target substrate 10 can construct a plurality of monochromatic pixels (each pixel includes a single micro photoelectric element 30) or a plurality of color pixels (each pixel includes multiple micro photoelectric elements 30), and this disclosure is not limited thereto. Any technical means equivalent to the technical feature of this disclosure can achieve the same technical effect.

Eighteenth Embodiment

The eighteenth embodiment is a repair method for the seventh embodiment, wherein the circuit extension segment C1*e* (even the repair line RL) of the corresponding micro photoelectric element 30 is formed after determining the repair position Pr. This embodiment shows the implement flexibility of the repair method of this disclosure.

Nineteenth Embodiment

In the eleventh embodiment to the eighteenth embodiment, the method for forming the electrical connection of the preset micro photoelectric element can be changed from the laser welding to the thermal effect method, which can be referred to the eighth embodiment to the tenth embodiment.

As mentioned above, the photoelectric device and its repair method of this disclosure can be widely applied to repair the photoelectric device mainly composed of micro photoelectric elements, and can be applied to repair a target substrate configured with a plurality of micro photoelectric elements without causing damage of the circuit structure or other good micro photoelectric elements around the defective product. This disclosure can solve the issue of repairing the micro photoelectric elements having uneven heights, which is caused by the tinny pitches and dimensions of the micro photoelectric elements as mounting a large amount of micro photoelectric elements on the circuit substrate, and the manufacturing process or raw material deviations.

In addition, the disclosure further comprises the following advantages. 1. This disclosure provides an effective, efficient and cost-controllable repair method. 2. The repair method provided by the present disclosure can be applied to repair a target substrate configured with a plurality of micro photoelectric elements without causing damage. 3. The repair method provided by the present disclosure is not only effective, efficient, and cost-controllable, but also capable of replacing the defective micro photoelectric element with the good micro photoelectric element on the target substrate on which other micro photoelectric elements are arranged. 4. The repair method provided by the present disclosure can be applied to the target substrate with active or passive matrix, or the monochromatic or color target substrate. 5. This disclosure can interrupt the circuit connection between the defective product and the circuit pattern layer by means of laser cutting or laser evaporation. 6. This repair method provided by the present disclosure almost leads to a repair result with visual distinguishableness.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A photoelectric device, comprising:
   a target substrate, wherein the target substrate is configured with a plurality of connection positions and a repair position disposed with an offset with relative to a corresponding one of the connection positions, and the offset is greater than zero;
   a circuit pattern layer disposed on the target substrate;
   a plurality of micro photoelectric elements disposed on the target substrate and electrically connected to the circuit pattern layer, wherein the micro photoelectric elements are individually disposed on at least a part of the connection positions of the target substrate, respectively; and
   a supplemental repair element disposed on the repair position of the target substrate, wherein the supplemental repair element has an electrode electrically connected to the circuit pattern layer, and on the target substrate, the supplemental repair element is arbitrary with respect to the micro photoelectric elements,
   wherein the target substrate comprises a plurality of connection position groups, which are composed of the connection positions, and the repair position is disposed adjacent to the corresponding connection position group and disposed with the offset with relative to the corresponding connection position, the micro photoelectric elements are divided into a plurality of micro photoelectric element groups, which are disposed corresponding to the connection position groups, respectively, the supplemental repair element is disposed on the repair portion disposed adjacent to one of the micro photoelectric element groups, each of the supplemental repair element and the micro photoelectric elements of the corresponding micro photoelectric element groups comprises two electrodes, one of the electrodes of the supplemental repair element is electrically connected to one of the electrodes of the micro photoelectric elements of the corresponding micro photoelectric element groups, and a circuit connection between the electric pattern layer and the other electrode of the corresponding micro photoelectric element of the micro photoelectric element group is replaced by a circuit connection between the circuit pattern layer and the other one of the electrodes of the supplemental repair element, wherein the micro photoelectric elements in each of the micro photoelectric element groups disposed corresponding to each of the connection position groups emit different color lights.

2. The photoelectric device of claim 1, wherein the electrode of the supplemental repair element is connected to the circuit pattern layer by laser welding.

3. The photoelectric device of claim 2, wherein a junction portion of the circuit pattern layer and the supplemental repair element is defined with a reflectivity less than 20%.

4. The photoelectric device of claim 1, wherein the micro photoelectric elements are arranged as a matrix array, and the supplemental repair element is disposed aside one of the micro photoelectric elements.

5. The photoelectric device of claim 1, wherein each of the supplemental repair element and the micro photoelectric elements is a flip-chip micro light-emitting diode.

6. The photoelectric device of claim 1, wherein the photoelectric device further comprises a cutting line, and the cutting line interrupts the circuit connection between the circuit pattern layer and the other electrode of the corresponding micro photoelectric element of the micro photoelectric element group.

7. The photoelectric device of claim 1, wherein the circuit pattern layer further comprises a repair line corresponding to the repair position, a circuit extension segment corresponding to one of the connection positions of the connection position groups, and a junction port formed by the circuit extension segment and the repair line, and the junction port is electrically connected to the repair line.

8. The photoelectric device of claim 7, wherein the junction port is connected to the repair line by laser welding.

9. The photoelectric device of claim 8, wherein a junction portion of the circuit pattern layer and the junction port is defined with a reflectivity less than 20%.

10. The photoelectric device of claim 1, wherein each of the micro photoelectric element groups comprises a red micro photoelectric element, a green micro photoelectric element and a blue micro photoelectric element.

* * * * *